United States Patent [19]

Liccese et al.

[11] Patent Number: 5,375,229

[45] Date of Patent: Dec. 20, 1994

[54] SYSTEM AND METHOD FOR ADDING A CONTROL FUNCTION TO A SEMICONDUCTOR EQUIPMENT SYSTEM

[75] Inventors: Joseph J. Liccese; David F. Jendresky, both of Austin, Tex.

[73] Assignee: Motorola, Inc., Schaumburg, Ill.

[21] Appl. No.: 867,568

[22] Filed: Apr. 13, 1992

[51] Int. Cl.⁵ .............................................. G06F 11/00
[52] U.S. Cl. ................................. 395/575; 364/222.6
[58] Field of Search .................... 395/575; 364/221.7, 364/222.6, 222.7, 222.8, 246.8, 286.5, 221.9; 371/19, 69.1, 55

[56] References Cited

U.S. PATENT DOCUMENTS

| | | | |
|---|---|---|---|
| 4,813,042 | 3/1989 | Maaloe et al. | 371/16 |
| 4,837,704 | 6/1989 | Lengefeld | 364/200 |
| 5,038,283 | 8/1991 | Caveney | 364/403 |
| 5,058,162 | 10/1991 | Santon et al. | 380/25 |
| 5,126,028 | 6/1992 | Hurwitt et al. | 204/192.13 |
| 5,138,713 | 8/1993 | Loten | 395/725 |

*Primary Examiner*—Robert W. Beausoliel, Jr.
*Assistant Examiner*—Joseph E. Palys
*Attorney, Agent, or Firm*—Keith E. Witek

[57] ABSTRACT

A semiconductor system (10) has a computer (16) coupled to equipment (14) for processing semiconductor wafers. The computer (16) has a CPU (18) for controlling and manipulating computer information, and a memory (16). A portion of the memory (14) stores programs, and is referred to as system code (17). A first portion of the system code (17) is used to store process equipment code (22) which provides control for equipment (14). A second portion of the system code (17) is used to store user function code (20) which provides system security and system/user error reduction. A user input device (28) is used by a human user to interface to the system (10). The user function code (20) prevents the process equipment code (22) from controlling equipment (14) until the human user has entered correct data regarding the wafers being prepared for processing, processing operation information for system (10), and/or like information.

16 Claims, 4 Drawing Sheets

SYSTEM AND METHOD FOR ADDING A CONTROL FUNCTION TO A SEMICONDUCTOR EQUIPMENT SYSTEM

COPYRIGHT NOTICE

A portion of the disclosure of this patent document contains material which is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

FIELD OF THE INVENTION

The present invention relates generally to semiconductor equipment systems, and more particularly, to adding functionality to semiconductor equipment systems.

BACKGROUND OF THE INVENTION

In semiconductor processing equipment systems, a human user or operator is responsible for controlling, monitoring, and recording semiconductor system performance and operation. Therefore, human errors are likely to occur. A single human error can be a costly and time consuming mistake. For example, a semiconductor processing system could process semiconductor wafers with an incorrect processing sequence, incorrect hardware, incorrect chemicals, or incorrect timing due to human error. As the complexity and capability of semiconductor equipment continues to increase, the occurrence of human error has the potential to increase.

To reduce human error, semiconductor equipment operators have been instructed to work in pairs or groups in order to double-check both the semiconductor system and the semiconductor wafers that are being processed. This method is costly in terms of man hours, open to negligence, and still results in a large number of human errors.

To further reduce the occurrence of human errors, computers have been added to semiconductor systems to allow for efficient use of the semiconductor system. Software packages provided by semiconductor equipment suppliers may make semiconductor equipment systems easier to use, but do not allow for error checking. Therefore, incorrect wafers are sometimes processed, or incorrect processes, chemicals, hardware, and timing are sometimes used.

In order to provide error checking capability to a semiconductor system, a semiconductor system supplier may develop and install error checking software code into existing semiconductor system code. This method is expensive and not feasible for semiconductor equipment suppliers due to the fact that all semiconductor manufacturers require different error checking algorithms, parameters, data, and options.

Another method for adding error checking functionality to a semiconductor system is to connect a semiconductor equipment system to a separate hardware system for error checking. Therefore, one computer or execution unit runs the semiconductor equipment while another system runs error checking algorithms. This method is expensive due to the added hardware overhead. The system is also more complex than desired due to the two independent execution devices or computers.

SUMMARY OF THE INVENTION

The previously mentioned disadvantages are overcome and other advantages achieved with the present invention. In one form, the present invention comprises a method for adding a control function to a semiconductor system. The inventive semiconductor system has a processor which is coupled to a memory. The memory stores both a user function portion of system code and a process equipment portion of system code. The processor is used to control semiconductor processing equipment. The method has a step for providing user data to the processor. The user data invokes the user function portion of system code and suspends the process equipment portion of system code. A control value and a first encoded value are provided from external to the semiconductor system. A first portion of the control value is encoded and compared with the first encoded value to determine if the first portion of the control value is equivalent to the first encoded value. A first valid signal is provided in response to an equivalence. A second encoded value is provided from a second portion of the control value. A second portion of the control value is encoded and compared with the second encoded value to determine if the second portion of the control value is equivalent to the second encoded value. A second valid signal is provided in response to an equivalence. An enable signal is provided in response to each of the first and second valid signals. The enable signal is used to invoke the process equipment code.

The present invention will be more clearly understood from the detailed description below in conjunction with the accompanying drawings.

DESCRIPTION OF THE PREFERRED EMBODIMENT

Figure 1:
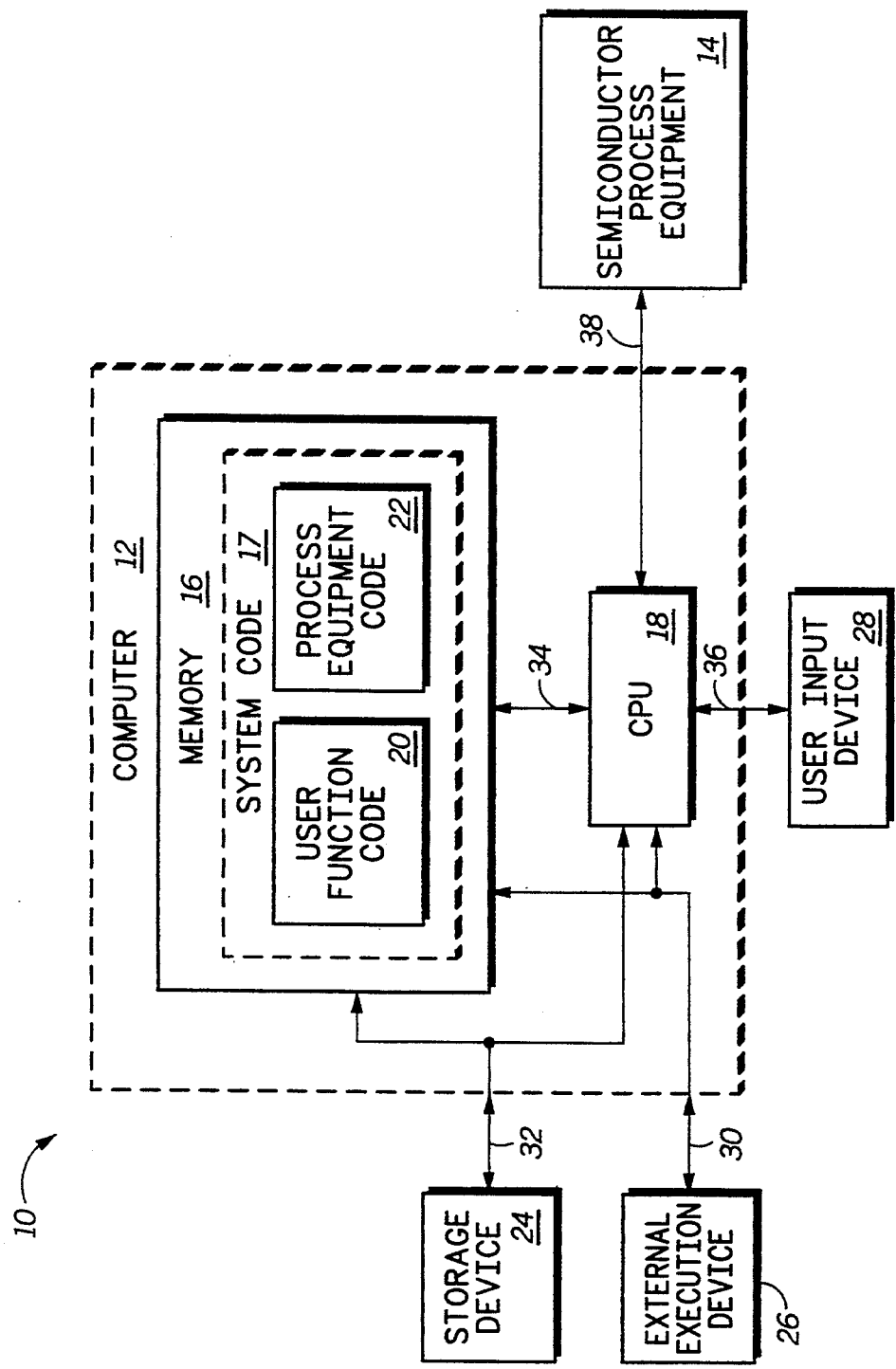
FIG. 1 illustrates, in a block diagram, a semiconductor system in accordance with the present invention.

Illustrated in FIG. 1 is a semiconductor system 10. The system 10 has a computer 12. The computer 12 is coupled to a semiconductor process equipment unit, referred to as equipment 14, via a conductor 38. Conductor 38 can be a simple conductor, a twisted pair, an RS-232 bus, an IEEE-488 bus, or the like. The equipment 14 may be any kind of semiconductor equipment such as a photolithographic stepper, etch equipment, a furnace, a chemical hood, deposition equipment, an ion implanter, a wafer transport system, photoresist equipment, wafer test equipment, wafer probe equipment, wafer repair equipment, or the like. The computer 12 is connected to a user input device 28 via a conductor 36. The user input device 28 may be a touch screen, a keyboard, a mouse, or the like. The user input device 28 is preferably a keyboard and allows for external data input by a human user. The computer 12 is connected to a storage device 24 via a conductor 32. The storage device 24 may be a floppy disk drive, a tape storage device, a hard disk drive, a bank of memory, or the like. The computer 12 is optionally connected to an external execution device 26 via a conductor 30. The external execution device 26 is usually another computer but may be a mainframe, a workstation, a network, a microprocessor, or the like.

The computer 12 has a memory device, referred to as memory 16. Memory 16 may have random access memory (RAM), read only memory (ROM), electrically erasable programmable memory (EEPROM), erasable programmable memory (EPROM), magnetic memory, disk drive storage, or the like, or any combination of the above memory elements. The memory 16 is controlled and accessed by a central processing unit (CPU) 18 via a conductor 34. The CPU 18 manipulates and controls computer 12 information and may control external data input to the computer 12. Each of the equipment 14, user input device 28, external execution device 26, and storage device 24 is capable of communication to the CPU 18. The storage device 24 and the external execution device 26 may have direct memory access (DMA) to the memory 16.

Memory 16 is used to store computer system information, computer data, an operating system, user input data, and/or the like. Memory 16 stores computer programs as system code 17 for execution by the CPU 18. The memory 16 stores user function code 20, which is a portion of the system code 17. In some cases, the user function code 20 may be referred to as a user function code program. The memory 16 stores process equipment code 22, which is a portion of the system code 17. In some cases, the process equipment code 22 may be referred to as a process equipment code program. The user function code 20 and the process equipment code 22 are preferably physically separate and distinct programs but may share subroutines, functions and/or code, memory, or be referred to as one program.

The user function code 20 is used for interfacing with the human user or other sources of data input. The user function code 20 performs four primary functions. A first function is to provide task swapping capabilities. The term "task swapping" means that the user function code 20 can stop a program from executing on the CPU 18 and start executing another program. This stopping and starting is usually respectively referred to as "suspending and invoking". The task swapping is capable of being performed based on user input and/or CPU 18 control. Task swapping is sometimes performed by calls to a memory-resident computer operating system or by a task swapping portion of the system code 17. A second function is to provide short term or long term data storage for the semiconductor system 10. The data storage may involve system performance records, system error records, and the recording of system operations anti utilization. A third function is to provide code that allows for a human user to interface with the system 10. A fourth function is to provide user input error checking for the system to reduce both user and system errors. The reduction of errors saves time and reduces costly semiconductor wafer scrap.

The process equipment code 22 is used for controlling the semiconductor process equipment 14. In many cases, the process equipment code 22 is a "canned" software package. Canned software means that the process equipment code 22 is a software package provided by a semiconductor process equipment supplier and is usually fixed in functionality, scope, and flexibility.

Figure 2:
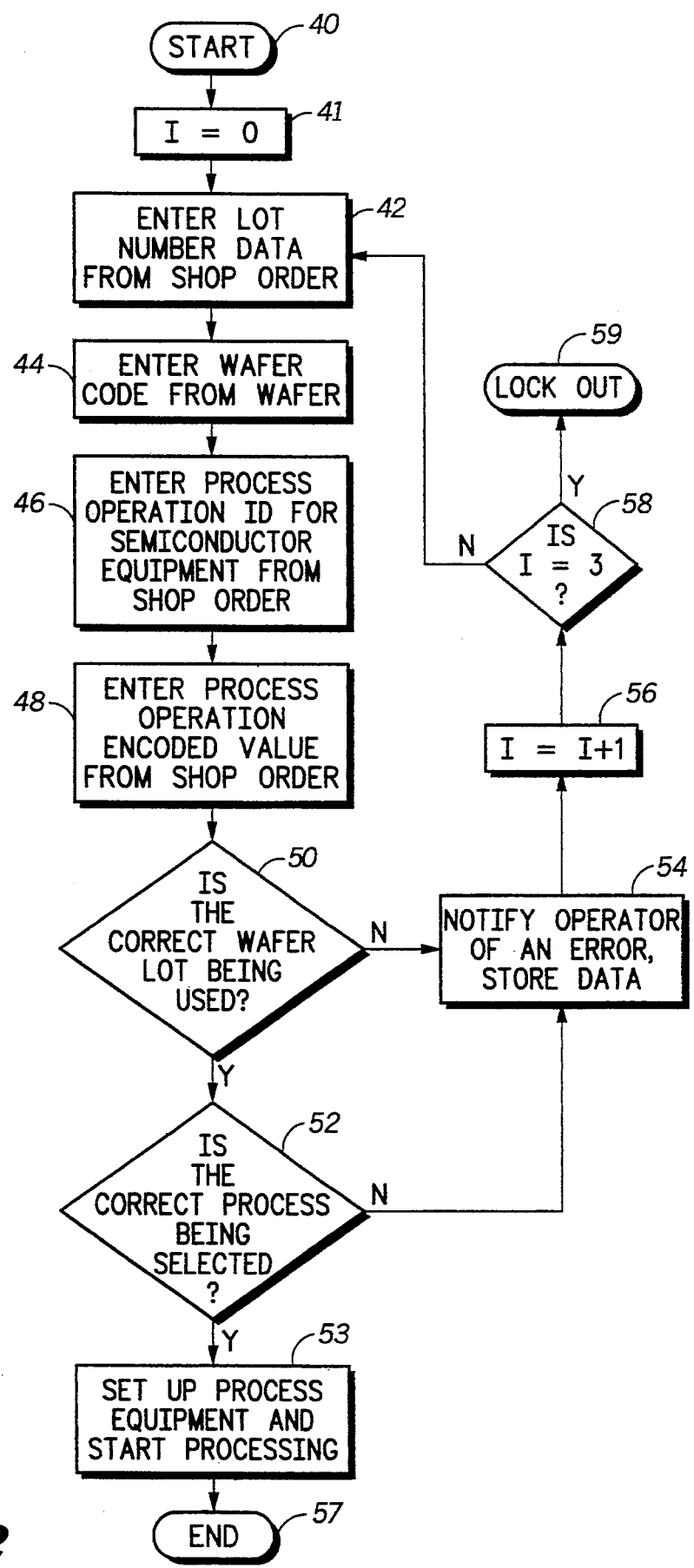
FIG. 2 illustrates in flowchart form a method of operating the semiconductor system of FIG. 1 in accordance with the present invention.

FIG. 2 illustrates, in a flowchart, a method for a human user to use the semiconductor system 10. In a step 40, the semiconductor system 10 is initialized and prepared. Once the system is fully operational, the user will enter a password, a key stroke, or the like to gain access to the semiconductor system 10. The system 10 then sets a variable to be equal to zero as illustrated in step 41. The variable is referred to as "I". The computer 12 will prompt the user to enter in computer information, referred to as a control value. The control value is used to initiate operations on the semiconductor system 10. The control value may be one entry or several entries. Usually, some form of semiconductor system operation identification is required as a user input.

One example of a control value input involves entering into the computer 12 a wafer lot number followed by a process identification code. The user is prompted to enter a wafer lot number in a step 42. The wafer lot number is located on a shop order that accompanies a wafer lot. A shop order contains important information regarding the wafer lot to which it is attached. After the wafer lot number is entered, the computer either prompts the user for a wafer code or receives the wafer code from a tracking system via the external execution device 26 in a step 44. The wafer code is an encoded value that is scribed or carved into each semiconductor wafer in the wafer lot. The user is prompted to enter a process operation identifier from the shop order in a step 46. The user enters the process operation identifier via the user input device 28. The computer 12 either receives a process operation encoded value from the tracking system or from the user in a step 48. The encoded process code, when entered by a user, is located on separate paperwork that is attached to the shop order.

If the computer 12 determines that the shop order, the wafers, the process operation, or the tracking system (if used) are incorrect in steps 50 and 52, then a step 54 is performed. In step 54 the operator is notified by a computer printout, a computer screen, an audio message, or the like that an error has occurred. In most cases the computer 12 will be able to determine what the error is, such as the wrong wafers are being used or the process operation is incorrect. A step 56 increments the variable "I". If it is determined in step 58 that a predetermined fixed number of errors has occurred, preferably three errors, then the user is locked out of the semiconductor system 10 in a step 59. In order to regain access to the system 10, either a command from the external execution device 26 must be communicated to system 10 or a password must be entered into the computer 12. Preferably, a supervisor or a shift engineer has control over the ability to regain access to system 10. If less than a predetermined fixed amount of errors has occurred the method returns to step 42 for new user data entry.

If the computer 12 determines in steps 50 and 52 that the shop order, the tracking system (if used), the wafers, and the process operation entered are all correct, then the computer 12 sets up the semiconductor equipment 14 with the correct wafers, information, and processes to perform the correct semiconductor operation. The semiconductor operation is performed in a step 53 and could involve photolithography, deposition, etching, material or chemical application, implantation, diffusing, cleaning, testing, repairing, and/or like wafer operations depending on equipment 14. The semiconductor system 10 completes the operation in a step 57 and awaits new user input. Once new user input is received, step 41 is initiated and the method of FIG. 2 is repeated.

It should be apparent that other parameters such as time of day, work shift, engineering approval, equipment status, priority, operator name, a total number of wafers in a wafer lot, and other parameters may be required as computer input to determine error-free access to the semiconductor equipment 14. The method described above may also allow for semiconductor equipment security as well as a reduction in processing errors.

Figure 3:
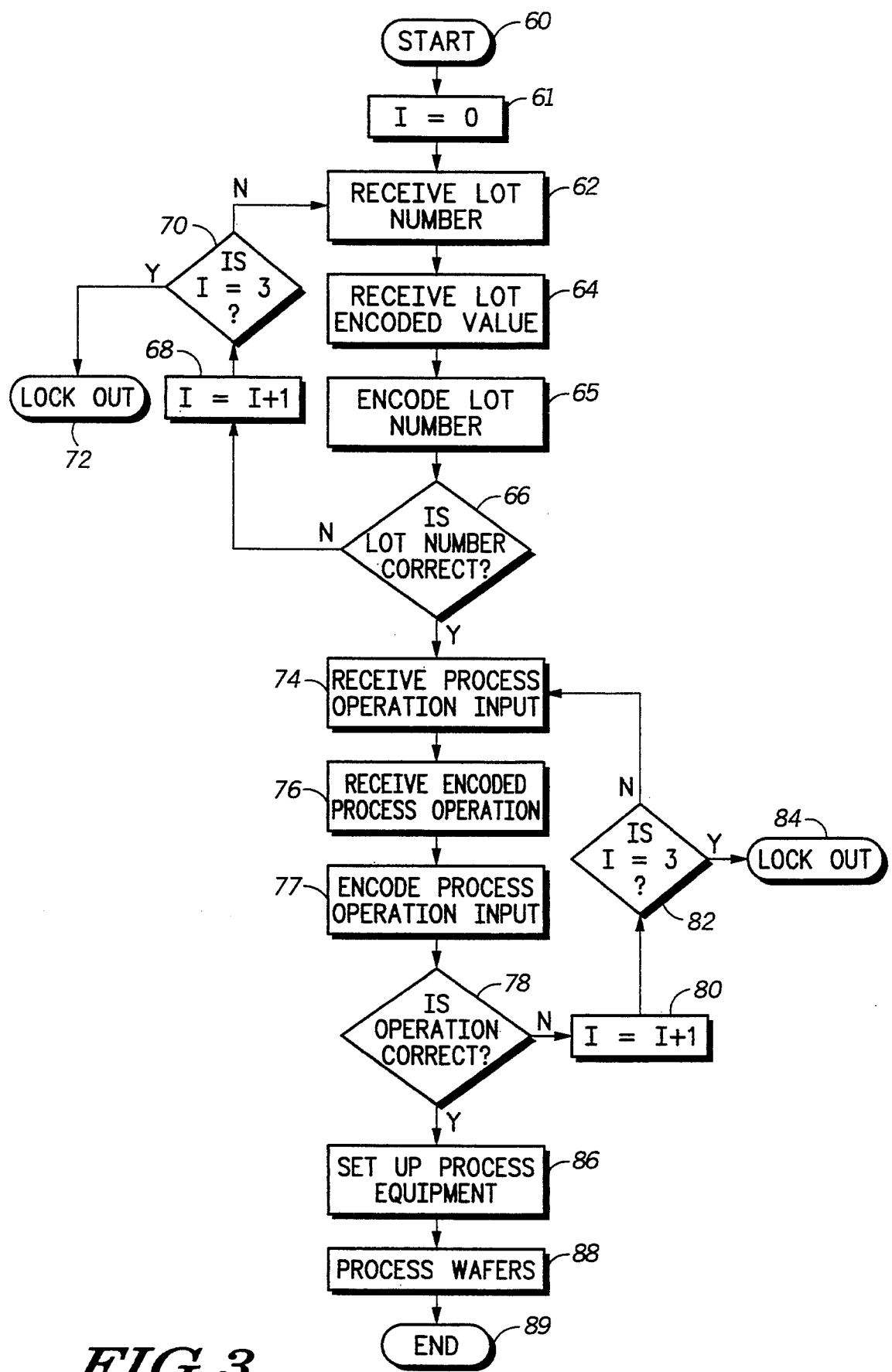
FIG. 3 illustrates in flowchart form a method of controlling and manipulating user data in the semiconductor system of FIG. 1 in accordance with the present invention.

In FIG. 3, a flowchart illustrates a method used by the semiconductor system 10 to determine if incorrect information is being entered into the computer 12. In FIG. 3, a step 60 is similar to the step 40 of FIG. 2. The step 60 is a preparation step to set up the proper software and hardware. Resets, interrupts, software loading, configuring, variable initialization, memory allocation, user input, and like known computer operations may be required to initially prepare the computer 12 and various peripherals for operation.

Once step 60 is complete, the semiconductor system 10 is ready and waiting for user input. Once the computer 12 senses user input, the computer 12 suspends execution of the process equipment code 22 and invokes the user function code 20. The user function code 20 determines if the user input requires error checking. If no error checking is needed, then the user function code 20 is suspended and the process equipment code 22 is invoked. In most cases, error checking of the user input is required due to the fact that user input usually involves critical system operation information. Critical system information is any information that alters the process in progress, starts a new process, runs diagnostics, changes equipment configuration, or the like. If error checking is required, the user function code 20 keeps executing while the process equipment code 22 remains suspended. The user function code 20 initializes a counter variable labeled "I" to zero.

In a preferred form, a lot number is received by the computer 12 usually via user input in a step 62. The user can find the lot information on a shop order document which accompanies all wafer lots. An encoded lot number value is received by the computer 12 from the user in a step 64. The encoded lot number that is entered into computer 12 is a scribed value which is located on each semiconductor wafer in a wafer lot. An external source, such as a wafer tracking system or computer, may also provide the encoded lot number value in another embodiment. The user function code 20 encodes the lot number, which was previously input by the user, to produce an internal encoded lot number in a step 65. The user function code 20 compares the encoded lot number and the internal encoded lot number in a step 66. This comparison determines if the shop order, the semiconductor wafers, and the lot number are correct.

If the lot number, the shop order, and the wafers are correct, the encoded lot number and the internal encoded lot number will be equivalent in step 66. If equivalence is determined, a first valid signal is stored and a step 74 is performed. If the lot number, the shop order, and the lot number values are not correct in step 66, then a step 68 is performed. In step 68, the variable "I", which indicates the number of errors that has occurred, is incremented. In a step 70, if "I" is greater than a fixed value, then the user is locked out of the semiconductor system 10 in a step 72 as described herein. In a preferred case the fixed value is three. If less than a predetermined fixed number of errors has occurred the step 62 is performed.

In a step 74, a process operation input is received by the computer 12 usually by user input. An encoded process operation is received via user input or an external source in a step 76. The user function code 20 then encodes the process operation, which was previously input by the user, to produce an internal encoded operation in a step 77. The user function code 20 then compares the encoded lot number of step 77 and the internal encoded lot number in a step 78. This comparison determines if the operation to be performed on the wafer lot is correct.

If the internal encoded process operation of step 77 is equivalent to the encoded process operation in step 78, then the process operation is correct, a second valid signal is stored, and a step 86 is performed. If the process operation is not correct in step 78, then a step 80 is performed. In step 80, the variable "I", which indicates the total number of errors that has occurred, is incremented. In a step 82, if "I" is greater than a fixed value then the user is locked out of the semiconductor system 10 in a step 84 as described herein. In a preferred case, the fixed value is three. If less than a predetermined fixed number errors has occurred the step 74 is performed.

In a step 86, the user function code 20 can optionally store information to an external storage device 24 for permanent data archiving and equipment tracking. An enable signal or an enable data value is derived from the first and second valid signals. The enable signal is usually determined by compare statements or like computer code. If the enable signal is asserted, the user function code 20 is suspended but kept in memory 16, and the process equipment code 22 is invoked. The correct wafers, process operation and other necessary parameters are communicated to the semiconductor process equipment 14 via the CPU 18 in step 86. The correct semiconductor wafers are processed with the correct operation in a step 88. In a step 89 the semiconductor system 10 is finished processing wafers and waits for new user input via step 60. The method of FIG. 3 has reduced operator error and decreased costly wafer scrap by ensuring correct wafer processing.

Figure 4:
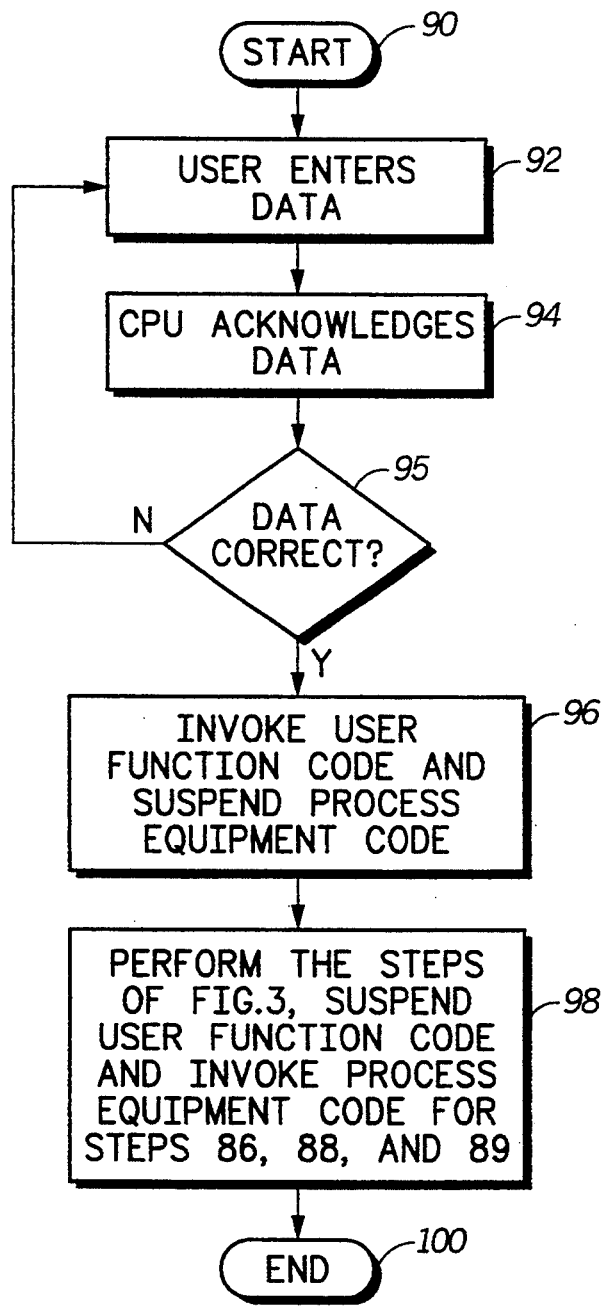
FIG. 4 illustrates in flowchart form a method of controlling the semiconductor system of FIG. 1 in accordance with the present invention.

In FIG. 4, a flowchart illustrates a method that is used to task swap between the user function code 20 and the process equipment code 22. A step 90 is a starting step that is similar to the starting steps 40 and 60 of FIGS. 2 and 3 respectively. A human user enters a password, user data, or a keystroke in a step 92 to gain access to the semiconductor system 10. If a password or a like method is used to gain access to the system 10, steps 92, 94 and 95 are used to check for a valid password.

Once a valid password or user data begins to be entered into computer 12, the user function code 20 is invoked and the process equipment code 22 is suspended in a step 96. The steps of FIG. 3 are performed in a step 98 of FIG. 4. The process equipment code 22 is invoked during or before step 86 of FIG. 3 and the user function code is suspended. This task swapping mechanism is performed for each access to the semiconductor system 10 to ensure that error checking is performed when needed. In a step 100 the processing of the wafers is complete and the system 10 waits for new user input.

The inventive system described herein provides system error reductions and security features that are currently not implemented in semiconductor systems. Furthermore, the inventive system presented herein has several advantages. One advantage is that the user function code 20 is separate from the process equipment code 22 in a preferred form. The process equipment code 22 is the portion of system code 17 that controls the equipment 14. Due to this separation, the user function code 20 is independent of the process equipment code 22, and may be customized to suit individual user needs without expensive overhead to the user or to the equipment supplier. The user function code 20 may also be customized to run on any semiconductor system or any kind of semiconductor equipment. Reduced errors result in reduced wafer scrap, increased profit, increased yield, and improved manufacturing time.

It is costly for an equipment supplier to alter the already tested and commercially available process equipment code 22 for every user. In addition, the altering of the process equipment code 22 to customize process equipment code for each user would result in several versions of the process equipment code 22. The development, testing, and marketing of several versions would be undesirable. Most equipment suppliers are therefore not willing to make changes to the process equipment code 22 to allow for improved security and system error checking. Therefore, with the user function code 20, supplier software alterations are not required, and system error checking and system security is achieved in an efficient and flexible manner.

The addition of the user function code 20 requires little overhead. The cost is minimal and little or no added hardware or hardware modifications are required for modern semiconductor equipment. The user function code 20 also allows for permanent data storage, logs of system diagnostics and errors, permanent performance data storage, and/or the like, via interfaces to external storage devices. Therefore, the user function code 20 can provide long-term data storage, scheduling, usage monitoring, and other key features that are not always present in a semiconductor system.

Furthermore, a computer program listing of one embodiment of a user software program is including hereinafter the detailed description. The computer program listing is used to further illustrate the software operation of the semiconductor system 10.

While the present invention has been illustrated and described with reference to specific embodiments, further modifications and improvements will occur to those skilled in the art. For example, the inventive method may run in a multi-tasking or windows environment. The inventive system may run while interfaced to a known and commercially available semiconductor wafer tracking system. Wafer tracking systems are used to track a plurality of wafers or a plurality of wafer lots through a wafer fabrication facility. The external execution device may be a tracking system, a mainframe, a central processor for a fabrication facility, an engineer's computer, a network connection to another office or facility, or the like. Several external execution devices may be connected. A plurality of semiconductor equipment units may be operated from one computer system. The computer itself may vary. The computer may be a personal computer (PC), a workstation, a mainframe, a custom hardware design, or the like. Various known encoding schemes can be used to determine equivalence of parameters in the inventive system. To reduce cycle time and increase the amount of information entered into system 10, it should be apparent that other means of user input are possible. Other types of user input include, bar code readers, speech recognition equipment, optical character recognition equipment, and the like. It is to be understood, therefore, that this invention is not limited to the particular forms illustrated and that it is intended in the appended claims to cover all modifications that do not depart from the spirit and scope of this invention.

Appendix

Computer Program Listing

```c
#include <nvl.h>
#include <dos.h>
#include <stdio.h>
include <stdlib.h> if   !(defined(__TINY__)  ||  defined(__SMALL__)  ||
defined(__MEDIUM__))
#error You must use tiny, small, or medium memory models
endif static void interrupt (*oldbreak)();
static void interrupt (*oldctrlc)();
static void interrupt (*oldtimer)();
static void interrupt (*old28)();
static void interrupt (*oldkb)();
```

```
static void interrupt (*olddisk)();
static void interrupt (*oldcrit)();
static void interrupt newtimer();
static void interrupt new28();
static void interrupt newkb();
static void interrupt newdisk();
static void interrupt newcrit();
static void interrupt newbreak();
static void interrupt ifunc();

static union REGS rg;
static struct SREGS seg;
static unsigned sizeprogram;
static unsigned dosseg;
static unsigned dosbusy;
static char far *mydta;
static unsigned myss;
static unsigned stack;
static unsigned intpsp;
static unsigned psps[2];
static int pspctr;
static int cflag;
static int kbval;
static int resoff = 0;
static int running = 0;
static int popflg = 0;
static int diskflag = 0;
static int avec = 0;
static int stat_flg = 0;

static unsigned int process_timer = 0;
int screen;
int datalog = 0;
char signature[] = "NEST";
unsigned keymask = 8;
int secure_flg = 1;
int lock_flg = 1;
int sex = 0;
```

```
static void resinit(void);
static void resident_psp(void);
static void interrupted_psp(void);
static unsigned resident(char *, void interrupt(*)());
static void terminate(void);
static void suspend(void);
static void resume(void);
static void resterm(void);
static void pspaddr(void);
static void execute_resident(void);

void securize(void);
void init_win(void);
void view_lots(void);
void get_mode(void);
void select_rcp(void);
void multi2(void);
void setup_rcp2(void);
void event_list(void);
void data_log(void);
void view_datalog(void);
void setup(void);
void lkck(void);
void display_error(int);
void set_vid_mem(void);
int is_idle(void);

extern unsigned _heaplen = 256;
extern unsigned _stklen = 256;

main(argc, argv)
char *argv[];
{
    union REGS rg;
    int ivec;

if ((ivec = resident(signature, ifunc)) != 0)
    {
        if (argc > 1)
        {
```

```c
    rg.x.ax = 0;
    if (strcmp(argv[1], "quit") == 0)
        rg.x.ax = 1;
    else if (strcmp(argv[1], "resume") == 0)
        rg.x.ax = 2;
    else if (strcmp(argv[1], "suspend") == 0)
        rg.x.ax = 3;
    if (rg.x.ax)
    {
            int86(ivec, &rg, &rg);
            return;
        }
        }
        printf("\n%s is already resident",signature);
    }
    else
    {
        printf("\nResident %s is loaded", signature);
        resinit();
    }
} void interrupt ifunc(bp,di,si,ds,es,dx,cx,bx,ax)
{
    if (ax == 1)
        terminate();
    else if (ax == 2)
        resume();
    else if (ax == 3)
        suspend();
}   /*end ifunc*/ void resinit()
{
    static char far *intdta;
    static unsigned intsp;
    static unsigned intss;

segread(&seg);
    myss = seg.ss;
```

```
    stack = _SP;
    rg.h.ah = 0x34;
    intdos(&rg, &rg);
    dosseg = _ES;
    dosbusy = rg.x.bx;
    mydta = getdta();
    pspaddr();
    oldtimer = getvect(TIMER);
    old28 = getvect(INT28);
    oldkb = getvect(KEYBD);
    olddisk = getvect(DISK);
    setvect(TIMER, newtimer);
    setvect(KEYBD, newkb);
    setvect(INT28, new28);
    setvect(DISK, newdisk);
    disable();
    intsp = _SP;
    intss = _SS;
    _SP = stack;
    _SS = myss;
    enable();
    intdta = getdta();
    setdta(mydta);
    resident_psp();
    init_win();
    interrupted_psp();
    setdta(intdta);
    disable();
    _SP = intsp;
    _SS = intss;
    enable();
    sizeprogram = myss + ((stack+50) / 16) - _psp;
    keep(0, sizeprogram);
} static void interrupt newbreak()
{
    return;
}
void interrupt newcrit(bp,di,si,ds,es,dx,cx,bx,ax,ip,cs,flgs)
```

```c
{
    ax = 0;

cflag = flgs;
} void interrupt newdisk(bp,di,si,ds,es,dx,cx,bx,ax,ip,cs,flgs)
{
    diskflag++;
    (*olddisk)();
    ax = _AX;
    newcrit();
    flgs = cflag;
    --diskflag;
} void interrupt newkb()
{
    unsigned int key;

key = inportb(0x60);
    kbval = peekb(0, 0x417);
    if(!resoff && secure_flg)
        pokeb(0, 0x417, kbval & 0xFB);
    if(key == F3)
        screen = 0;
    else if(key == F4)
        screen = 4;
    else if(key == F2)
        screen = 2;
    else if(key == F8)
        lock_flg = 0;
    else if(stat_flg == 10 && ((((kbval & keymask) ^ keymask) == 0)
            && key == ALT_H) ¦¦ screen != 2))
    {
        sex = 0;
        stat flg = 11;
        popflg = 1;
    }
    else if(!resoff && sex == 1 && key == END)
```

```
            stat_flg = 3;
      else if(!resoff && sex == 10)
            stat_flg = 12;
      else if(!resoff && sex == 11)
            stat_flg = 13;
      else if(!resoff && sex == 8 && key == END)
            stat_flg = 10;
      else if(!resoff && (sex == 2 || sex == 5 || sex == 7))
            stat_flg = 4;
      else if(!resoff && sex == 4)
            stat_flg = 5;
      else if(!resoff && sex == 6)
            stat_flg = 6;
      else
      {
            if ((!resoff) && ((secure_flg && (((kbval & keymask) ^ keymask) == 0))
                 || (key == F9 && lock_flg && secure_flg) ||
                 ((((kbval & keymask) ^ keymask) == 0) && (key == F6 ||
                  key == F7 || key == F10))))
            {
            if((key == ALT_W && screen == 2) ||
                (key == ALT_S && sex != 3 && screen == 2) ||
                (key == ALT_D && screen == 4) ||
                (key == ALT_S && screen == 4) ||
                 key == ALT_Z || key == F9 || key == F10 ||
                 key == F1 || key == F6 || key == F7)
      {
            kbval = inportb(0x61);
            outportb(0x61, kbval | 0x80);
            outportb(0x61, kbval);
            disable();
            outportb(0x20, 0x20);
            enable();
            if(key != ALT_D && key != ALT_S && key != ALT_Z)
            {
                if (key != F9)
                popflg = 1;
                switch(key)
                {
```

```
                case F1:
                    stat_flg = 2;
                    break;
                case F6:
                    stat_flg = 7;
                    break;
                case F7:
                    stat_flg = 9;
                    break;
                case F10:
                    stat_flg = 1;
                    break;
            }
        }
        return;
        }
        }
        else
        if(key == F9 && !lock_flg && secure_flg)
        {
            lock_flg = 1;
            sex = 0;
        }
    }
    (*oldkb)();
} void interrupt newtimer()

{
    int far *farptr = (int far *) 0x417;

(*oldtimer)();
    if(!resoff && secure_flg)
        *(farptr) = *(farptr) & 0xFB;
    if((stat_flg != 0 && sex != 3) || datalog)
        process_timer++;

else if((!running) && ((popflg) || ((process_timer > DELAY1) &&
        (sex != 1 && sex != 8 && sex != 9)) || ((process_timer >
```

```
DELAY2 )
            && (sex == 1 || sex == 8)) || ((process_timer > DELAY3)
            && stat_flg == 10)) && (peekb(dosseg, dosbusy) == 0))
        if (diskflag == 0)
        {
        outportb(0x20, 0x20);
        popflg = process_timer = 0;
        if(datalog)
        {
            stat_flg = 8;
            datalog = 0;
        }
        execute_resident();
        if(sex == 2 || sex == 5 || sex == 7)
            stat_flg = 4;
        else if(sex == 4)
            stat_flg = 5;
        else if(sex == 6)
            stat_flg = 6;
        else if(sex == 10)
            stat_flg = 12;
        else if(sex == 11)
            stat_flg = 13;
        }
}
void interrupt new28()
{
    (*old28)();
    if((stat_flg != 0 && sex != 3) || datalog)
        process_timer++;

if((!running) && ((popflg) || ((process_timer > DELAY1) &&
        (sex != 1 && sex != 8 && sex != 9)) || ((process_timer >
DELAY2 )
        && (sex == 1 || sex == 8)) || ((process_timer > DELAY3)
        && stat_flg == 10)) && (peekb(dosseg, dosbusy) != 0))
    {
        popflg = process_timer = 0;
        if(datalog)
        {
```

```
                stat_flg = 8;
                datalog = 0;
            }
            execute_resident();
            if(sex == 2 || sex == 5 || sex == 7)
             stat_flg = 4;
            else if(sex == 4)
            stat_flg = 5;
            else if(sex == 6)
            stat_flg = 6;
            else if(sex == 10)
            stat_flg = 12;
            else if(sex == _1)
            stat_flg = 13;
        }
} void resident_psp()
{
    int pp;
    intpsp = peek(dosseg, *psps);
    for (pp = 0; pp < pspctr; pp++)
        poke(dosseg, psps [pp], _psp);
} void interrupted_psp()
{
    int pp;

for (pp = 0; pp < pspctr; pp++)
        poke(dosseg, psps [pp], intpsp);
} static void execute_resident()
{
    static char far *intdta;
    static unsigned intsp;
    static unsigned intss;
    static unsigned ctrl_break;
```

```
running = 1;
disable();
intsp = _SP;
intss = _SS;
_SP = stack;
_SS = myss;
enable();
oldcrit = getvect(CRIT);
oldbreak = getvect(CTRLBRK);
oldctrlc = getvect(CTRLC);
setvect(CRIT, newcrit);
setvect(CTRLBRK, newbreak);
setvect(CTRLC, newbreak);
ctrl_break = getcbrk();
setcbrk(0);
intdta = getdta();
setdta(mydta);
resident_psp();
set_vid_mem();
switch(stat_flg)
{
    case 0:
    securize();
    break;
    case 1:
    passwd();
    break;
    case 2:
    view_lots();
    break;
    case 3:
    get_mode();
    break;
    case 4:
    select_rcp();
    break;
    case 5:
    multi2();
    break;
    case 6:
```

```
        setup_rcp2();
        break;
    case 7:
        event_list();
        break;
    case 8:
        data_log();
        break;
    case 9:
        view_datalog();
        break;
    case 10:
        if(is_idle())
            get_mode();
        break;
    case 11:
        display_error(26);
        break;
    case 12:
        setup();
        break;
    case 13:
        lkck();
        break;
    default:
        break;
    }
stat_flg = 0;
if(sex == 9)
    stat_flg = 10;
interrupted_psp();
setdta(intdta);
setvect(CRIT, oldcrit);
setvect(CTRLBRK, oldbreak);
setvect(CTRLC, oldctrlc);
setcbrk(ctrl_break);
disable();
_SP = intsp;
_SS = intss;
enable();
```

```c
      running = 0;
} unsigned resident(signature, ifunc)
char *signature;
void interrupt (*ifunc)();
{
   char *sg;
   unsigned df;
   int vec;

segread(&seg);
   df = seg.ds-seg.cs;
   for (vec = 0x60; vec < 0x68; vec++)
   {
      if (getvect(vec) == NULL)
      {
      if (!avec)
         avec = vec;
      continue;
      }
      for (sg = signature; *sg; sg++)
      if (*sg!=peekb(peek(0,2+vec*4)+df,(unsigned)sg))
         break;
      if (!*sg)
         return vec;
   }
   if (avec)
   setvect(avec, ifunc);
   return 0;
} static void pspaddr()
{
   unsigned adr = 0;
   unsigned enddos;

rg.h.ah = 0x52;
   intdos(&rg, &rg);
   enddos = _ES;
```

```
enddos = peek(enddos, rg.x.bx-2);
while (pspctr < 2 && (unsigned)((dosseg<<4) + adr) <
(enddos<<4))
    {
       if (peek(dosseg, adr) == _psp)
       {
       rg.h.ah = 0x50;
       rg.x.bx = _psp + 1;
       intdos(&rg, &rg);
       if (peek(dosseg, adr) == _psp+1)
          psps[pspctr++] = adr;
       rg.h.ah = 0x50;
       rg.x.bx = _psp;
       intdos(&rg, &rg);
       }
       adr++;
    }
} static void resterm()
{
   setvect(TIMER, oldtimer);
   setvect(KEYBD, oldkb);
   setvect(INT28, old28);
   setvect(DISK, olddisk);
   setvect(avec, (void interrupt (*)()) 0);
   freemem(peek(_psp, 0x2c));
   freemem(_psp);
} void terminate()
{
   if(getvect(DISK) == (void interrupt (*)()) newdisk)
      if(getvect(KEYBD) == newkb)
      if(getvect(INT28) == new28)
         if(getvect(TIMER) == newtimer)
         {
            resterm();
            return;
         }
```

```
        resoff = 1;
} void resume()
{
    resoff = 0;
} void suspend()
{
    resoff = 1;
} ifndef __DOS_H
include <dos.h>
endif ifndef __STDIO_H
include <stdio.h>
endif ifndef __STDLIB_H
include <stdlib.h>
endif include <string.h>
include <ctype.h>
#include <fcntl.h>
#include <dir.h>
#include <conio.h>
#include <bios.h>
#include <io.h>
include <win.h> int old_col, old_row;
struct window_frame frame[MAX_FRAME];
char video;
char far *vid_mem;
char wp[MAX_FRAME][VID_SIZE];
```

```
void tsrwindow(num, attr)
int num, attr;
{
   if(!frame[num].active)
   {
      save_video(num);
      frame[num].active = 1;
   } if(frame[num].border)
      draw_border(num);
   display_header(num, attr);
} int make_tsrwindow(num, header, startx, starty, endx, endy, border,
norm_vid, rev_vid)
int num;
char *header;
int startx, starty;
int endx, endy;
int border;
int norm_vid;
int rev_vid;
{ if(num > MAX_FRAME)
   {
      tsrwindow_puts(0, "Too many windows\n");
      return 0;
   } if((startx > 78) || (startx < 0) || (starty > 24) || (starty < 0))
   {
      tsrwindow_puts(0, "range error\n");
      return 0;
   } if((endx > 79) || (endy > 25))
   {
```

```
            tsrwindow_puts(0, "window won't fit\n");
            return 0;
        }
        frame[num].startx = startx;
        frame[num].endx = endx;
        frame[num].starty = starty;
        frame[num].endy = endy;
        frame[num].ptr = wp[num];
        frame[num].header = header;
        frame[num].border = border;
        frame[num].active = 0;
        frame[num].curx = 0;
        frame[num].cury = 0;
        frame[num].norm_vid = norm_vid;
        frame[num].rev_vid = rev_vid;
        return 1;
} void deactivate(num)
int num;
{ frame[num].curx = 0;
    frame[num].cury = 0;
    restore_video(num);
} void display_header(num, attr)
int num, attr;
{
    register int x, len;

x = frame[num].startx;

len = strlen(frame[num].header);
    len = (frame[num].endx - x - len) / 2;
    if(len < 0)
        return;
    x = x + len;
    write_string(x, frame[num].starty, frame[num].header,
```

```
            (frame[num].norm_vid | attr));
} void draw_border(num)
int num;
{
   register int i;
   char far *v, far *t;

v = vid_mem;
   t = v;

for(i = frame[num].starty + 1; i < frame[num].endy; i++)
   {
      v += (i * 160) + frame[num].startx * 2;
      *v++ = 186;
      *v = frame[num].norm_vid;
      v = t;
      v += (i * 160) + frame[num].endx * 2;
      *v++ = 186;
      *v = frame[num].norm_vid;
      v = t;
   }
   for(i = frame[num].startx + 1;i < frame[num].endx; i++)
   {
      v += (frame[num].starty * 160) + i * 2;
      *v++ = 205;
      *v = frame[num].norm_vid;
      v = t;
      v += (frame[num].endy * 160) + i * 2;
      *v++ = 205;
      *v = frame[num].norm_vid;
      v = t;
   }
   write_char(frame[num].startx,   frame[num].starty,   201,
frame[num].norm_vid);
   write_char(frame[num].startx,   frame[num].endy,   200,
frame[num].norm_vid);
   write_char(frame[num].endx,   frame[num].starty,   187,
frame[num].norm_vid);
```

```c
      write_char(frame[num].endx,   frame[num].endy,   188,
frame[num].norm_vid);
} int tsrwindow_puts(num, str)
int num;
char *str;
{
   if(!frame[num].active)
       return 0;

for(; *str; str++)
       tsrwindow_putchar(num, *str);
   return 1;
} int tsrwindow_putchar(num, ch)
int num;
char ch;
{
register int x, y;
char far *v;

if(!frame[num].active)
    return 0;

x = frame[num].curx + frame[num].startx + 1;
y = frame[num].cury + frame[num].starty + 1;
v = vid_mem;
v += (y * 160) + x * 2;
if(y >= frame[num].endy)
    return 1;
if(x >= frame[num].endx)
    return 1;
if(ch == '\n')
{
   y++;
   x = frame[num].startx + 1;
   v = vid_mem;
   v += (y * 160) + x * 2;
```

```c
            frame[num].cury++;
            frame[num].curx = 0;
        }
        else
            if(ch == ENTER)
                return 1;
        else
        {
            frame[num].curx++;
            *v++ = ch;
            *v++ = frame[num].norm_vid;
        }
        tsrwindow_xy(num, frame[num].curx, frame[num].cury);
        return 1;
}
int tsrwindow_xy(num, x, y)
int num, x, y;
{ if(x < 0 || x + frame[num].startx >= frame[num].endx - 1)
        return 0;
    if(y < 0 || y + frame[num].starty >= frame[num].endy - 1)
        return 0;
    frame[num].curx = x;
    frame[num].cury = y;
    goto_xy(x + frame[num].startx + 1, y + frame[num].starty + 1);
    return 1;
} void tsrwindow_gets(num, str)
int num;
char *str;
{
    char ch, *temp;

temp = str;
    for(;;)
    {
        ch = tsrwindow_getche(num);
        switch (ch)
```

```
        {
        case ENTER:
            *str = NULL;
            return;
        case BKSP:
            if(str > temp)
            {
                str--;
                frame[num].curx--;
                if(frame[num].curx < 0)
                frame[num].curx = 0;
                tsrwindow_xy(num, frame[num].curx, frame[num].cury);
                write_char(frame[num].startx + frame[num].curx + 1,
frame[num].starty
                    + frame[num].cury + 1, ' ',frame[num].norm_vid);
            }
            break;
        default:
            if(ch != NULL)
            {
                *str = ch;
                str++;
            }
        }
    }
} int tsrwindow_getche(num)
int num;
{ union inkey
    {
        char ch[2];
        int i;
    }c;

if(!frame[num].active)
        return 0;
```

```
tsrwindow_xy(num, frame[num].curx, frame[num].cury);
c.i = bioskey(0);
if(c.ch[0])
{
   switch(c.ch[0])
   {
   case ENTER:
      case BKSP:
         break;
      default:
         c.ch[0] = toupper(c.ch[0]);
         if(frame[num].curx + frame[num].startx < frame[num].endx
-1)
         {
            write_char(frame[num].startx + frame[num].curx + 1,
               frame[num].starty + frame[num].cury + 1, c.ch[0],
               frame[num].norm_vid);
            frame[num].curx++;
         }
      }
      if(frame[num].curx < 0)
      frame[num].curx = 0;
      if(frame[num].curx + frame[num].startx > frame[num].endx - 2)
      frame[num].curx--;
      tsrwindow_xy(num, frame[num].curx, frame[num].cury);
   }
   return c.i;
} int tsrwindow_getch(num)
int num;
{ union inkey
   {
      char ch[2];
      int i;
   }c;

if(!frame[num].active)
```

```
            return 0;

tsrwindow_xy(num, frame[num].curx, frame[num].cury);
        c.i = bioskey(0);
        if(c.ch[0])
        {
            switch(c.ch[0])
            {
            case ENTER:
            case BKSP:
                break;
            default:
                c.ch[0] = toupper(c.ch[0]);
            } if(frame[num].curx < 0)
            frame[num].curx = 0;
            if(frame[num].curx + frame[num].startx > frame[num].endx - 2)
            frame[num].curx--;
            tsrwindow_xy(num, frame[num].curx, frame[num].cury);
        }
        return c.i;
    } void tsrwindow_cls(num)
    int num;
    {
        register int i, j;
        char far *v;

for(i = frame[num].starty + 1; i < frame[num].endy; i++)
            for(j = frame[num].startx + 1; j < frame[num].endx; j++)
            {
            v = vid_mem;
            v += (i * 160) + j * 2;
            *v++ = ' ';
            *v = frame[num].norm_vid;
            }
        frame[num].curx = 0;
```

```c
        frame[num].cury = 0;
} void tsrwindow_cleol(num)
int num;
{
    register int i, x, y;

x = frame[num].curx;
    y = frame[num].cury;
    tsrwindow_xy(num, frame[num].curx, frame[num].cury);
    for(i = frame[num].curx; i < frame[num].endx - 1; i++)
        tsrwindow_putchar(num, ' ');
    tsrwindow_xy(num, x, y);
} void write_string(x, y, p, attrib)
int x, y;
char *p;
int attrib;
{
    char far *v;

v = vid_mem;
    v+= (y * 160) + x * 2;
    for(; *p;)
    {
        *v++ = *p++;
        *v++ = attrib;
    }
} void write_char(x, y, ch, attrib)
int x, y;
char ch;
{
    char far *v;

v = vid_mem;
```

```
        v += (y * 160) + x * 2;
        *v++ = ch;
        *v = attrib;
} void save_video(num)
int num;
{
    register int i, j;
    char *buf_ptr;
    char far *v, far *t;

buf_ptr = frame[num].ptr;
    v = vid_mem;
    for(i = frame[num].startx; i < frame[num].endx + 1; i++)
        for(j = frame[num].starty; j < frame[num].endy + 1; j++)
        {
        t = (v + (j * 160) + i * 2);
        *buf_ptr++ = *t++;
        *buf_ptr++ = *t;
        *(t - 1) = ' ';
        }
} void restore_video(num)
int num;
{
    register int i, j;
    char far *v, far *t;
    char *buf_ptr;

buf_ptr = frame[num].ptr;
    v = vid_mem;
    t = v;
    for(i = frame[num].startx; i < frame[num].endx + 1; i++)
        for(j = frame[num].starty; j < frame[num].endy + 1; j++)
        {
        v = t;
        v += (j * 160) + i * 2;
        *v++ = *buf_ptr++;
        *v = *buf_ptr++;
```

```
    }
    frame[num].active = 0;
} void goto_xy(x, y)
int x, y;
{
    union REGS r;

r.h.ah = 2;
    r.h.dl = x;
    r.h.dh = y;
    r.h.bh = 0;
    int86(0x10, &r, &r);
} video_mode()
{
    union REGS r;

r.h.ah = 15;
    return int86(0x10, &r, &r) & 255;
} void cursor_pos()
{
    union REGS i, o;
    i.h.bh = 0;
    i.h.ah = 3;
    int86(0x10, &i, &o);

old_row = o.h.dh;
    old_col = o.h.dl;
} void read_at_cursor(str)
char *str;
{
    int x;
    char far *p;
```

```c
    union REGS i, o;

i.h.bh = 0;
    i.h.ah = 3;
    int86(0x10, &i, &o);

p = vid_mem + (o.h.dh + 160) + (o.h.dl + 2);
    for(x = 0;*p && p < vid_mem + VID_SIZE && x < 78; x++)
    {
        if(isspace(*p) || strchr("(!,;{}[]<>",*p))
        break;
        *str = *p;
        p += 2;
        str++;
    }
    *str = NULL;
    if(!x)
    {
        p -= 2;
        while(!isspace(*p) && !strchr("(!,;{}[]<>", *p))
        p -= 2;
        p += 2;
        for(x = 0; *p && p >= vid_mem && x < 78; x++)
            {
            if(isspace(*p) || strchr("(!,;{}[]<>", *p))
                break;
            *str = *p;
            p += 2;
            str++;
            }
        *str = NULL;
    }
} void set_vid_mem()
{
    int vmode;

vmode = video_mode();
    if((vmode != 2) && (vmode != 3) && (vmode != 7))
```

```c
    {
        printf("video must be in 80 column text mode\n");
        exit(1);
    } if(vmode == 7)
        vid_mem = (char far *) MK_FP(0xB000, 0000);
    else
        vid_mem = (char far *) MK_FP(0xB800, 0000);
} ifndef __NVL_H
include <nvl.h>
endif ifndef __WIN_H
include <win.h>
#endif
#ifndef __FCNTL_H
#include <fcntl.h>
endif ifndef __STAT_H
include <stat.h>
endif ifndef __DOS_H
include <dos.h>
endif ifndef __IO_H
include <io.h>
endif include <time.h> define valid_char(c) \
((c>='0'&&c<='9')||(c>='A'&&c<='Z')||(c>='a'&&c<='z'))

struct data_field field[MAX_FIELD];
```

```
struct rcp_table table[MAX_TABLE];
struct buffers lot_info[MAX_LOTS];
static char pw[MAX_BUF];
static char msk1[] = "_____";
static char msk2[] = "_____";
static char msk3[] = "_____";
static char msk4[] = "_____";
static char recipe1_name[MAX_BUF];
static char recipe2_name[MAX_BUF];
static char temp[MAX_BUF];
static int table_count = 0;
static int try_flg = 0;
static int mode = 0;
static int lot_counter, status;
static char wc_1[5], wc_2[5], wc_3[5];
static char logfile[] = {"tsr1.log"};
static int cm;
static int ascii_scan[10][2] = {{0x30,0x0b},{0x31,0x02},{0x32,0x03},
            {0x33,0x04},{0x34,0x05},{0x35,0x06},
            {0x36,0x07},{0x37,0x08},{0x38,0x09},
            {0x39,0x0a}};

unsigned far *headptr;
unsigned far *tailptr;
extern char far *vid_mem;
extern struct window_frame frame[];
extern int old_col, old_row;
extern int sex, secure_flg, lock_flg;
extern int datalog;
extern int screen;
void securize(), passwd(), view_lots(), init_win();
void menu(), utility(), highlight(int, int, int, int);
void cursor(int, int, int), data_log(), view_datalog();
void init_field(int, int, int, char *, char *, int (*)());
void establish_field(), display_field(int, int, int);
void new_pw(), key_fake(int, int), display_error(int);
void crypt(char[], char[], int), sequence_keys(int);
void figure_checksum(int, char *, char *), shift_it(long *, long *);
```

```c
void process_it(char *, long *), format_str(int, long, char *);
void read_field(int, int *, int), select_rcp(), lkck();
void table_routines(), read_table(), write_table(), add_to_table();
void delete_from_table(), view_table(), get_mode(), setup();
void multi1(), multi2(), setup_rcp2(), get_wc(), event_list();
void restrict(int), get_text(int, int, int, int, char *);
int r_active(), c_active();
int read_pw(char [], char []), write_pw(char [], char []);
int menu_dn(), validate(), current_mode();
int char_to_ascii(char), is_idle();
int lot_entry(), wafer_entry(), op_entry(), rcp_entry();
int search_table(int, int *, char *);
char move_highlight(int, int *, int *);
long Cdiv(long, long), Cmod(long, long);

void passwd()
{
   int error_flg;
   int i = 4;
   char sys_pw[MAX_BUF];
   char eng_pw[MAX_BUF];

if(secure_flg)
   {
      set_vid_mem();
      cursor_pos();
      tsrwindow(1, NORMAL);
      tsrwindow_cls(1);
      tsrwindow_puts(1, PROMPT5);
      display_field(1, 4, 1);
      pw[0] = NULL;
      read_field(1, &i, OFF);
      deactivate(1);
      goto_xy(old_col, old_row);
      if(*field[4].fbuff != ESC)
      {
         if(pw[0] != NULL)
         {
            if(strcmp(pw, "NEW") == 0)
               new_pw();
```

```
        else
        {
            error_flg = read_pw(eng_pw, sys_pw);
            if(!error_flg)
            {
            if(strcmp(pw, sys_pw) == 0)
             {
                lock_flg = secure_flg = 0;
                sex = 3;
                display_error(3);
             }
            else if(strcmp(pw, eng_pw) == 0)
                menu();
            else
            {
                display_error(error_flg);
                key_fake(NULL, 0x4f);
            }
            }
            else
            display_error(error_flg);
        }
      }
     }
    }
    else
    {
        secure_flg = lock_flg = 1;
        sex = 0;
        display_error(4);
    }
} void securize()
{
    int i - 0;
    int ii = 0;

if(sex == 1)
        return;
```

```
      lock_flg = 1;
      if(try_flg >= 3 || !menu_dn())
      {
          if(try_flg >= 3)
          display_error(13);
          return;
      }
      if(table_count == 0)
      {
          read_table();

if(table_count == 0)
          {
          display_error(11);
          return;
          }
      } set_vid_mem();
      cursor_pos();
      tsrwindow(0, NORMAL);
      lot_counter = try_flg =  0;
      tsrwindow_cls(0);
      tsrwindow_puts(0, PROMPT1);
      tsrwindow_puts(0, PROMPT2);
      tsrwindow_puts(0, PROMPT3);
      tsrwindow_puts(0, PROMPT4);
      display_field(0, 0, 4);
      do
      {
          ii = i;
          status = 0;
          *field[ii].fbuff = NULL;
          display_field(0,i,1);
          read_field(0, &i, ON);

if(*field[ii].fbuff == ESC)
          break;
      if(*field[ii].fbuff == NULL)
      {
      display_error(5);
```

```
continue;
}
if(i == ii)
status = (field[ii].fvalid)();
else if(ii > i)
display_field(0,ii,1);

switch (status)
{
case 0:
    break;
case 1:
    if(ii == i)
        i++;
    break;
case 2:
    i = 4;
    status = 2;
    break;
case 3:
    i = 0;
    break;
case 4:
    i = 2;
    break;
case 5:
    ii = i = 0;
    lot_counter = 0;
    display_field(0, 0, 4);
    break;
case 6:
    i = 4;
    break;
case 7:
    i = 4;
    break;
}
if(status == 1 && i == 4)
{
status = 0;
```

```
        display_field(0,0,4);
        lot_counter++;
        ii = i = 0;
        try_flg = 0;
        }

}while(try_flg < 3 && i < 4 && *field[ii].fbuff != ESC
    && lot_counter < MAX_LOTS);
if(lot_counter > 0)
{
    try_flg = 0;
    key_fake(NULL, ALT_W);
    if(status == 7)
    {
    datalog = 1;
    sex = 3;
    }
    else if(current_mode() != 1 && mode == 0)
    sex = 1;

else
    sex = 8;
} else if(status == 6)
{
    lot_counter++;
    data_log();
    screen = 4;
        cm = current_mode();
        key_fake(NULL, F4);
        sex = 11;
    } if(try_flg >= 3)
        display_error(13);

deactivate(0);
    goto_xy(old_col, old_row);
}
```

```c
void get_text(int scol, int srow, int ecol, int erow, char *bptr)
{
    register int i, j;
    int correction_factor = 0;
    char far *v, far *t;

v = vid_mem;
    if(vid_mem == (char far *) 0xB0000000)
        correction_factor = 1;
    for(i = scol - 1;i < ecol;i++)
        for( j = srow - 1;j < erow;j++)
        {
        t = (v + (j * 160) + (i + correction_factor) * 2);
        *bptr++ = *t++;
        *bptr++ = *t;
        }
} void menu()
{
    char status;
    int xx, yy;

cursor_pos();
xx = frame[4].startx + 1;
yy = frame[4l].starty + 1;
tsrwindow(4, NORMAL);
tsrwindow_cls(4);
tsrwindow_puts(4, "RESET\n");
tsrwindow_puts(4, "UTILITY\n");
tsrwindow_puts(4, "RECIPES\n");
tsrwindow_puts(4, "RESTRICT\n");
tsrwindow_puts(4, "UNRESTRICT\n");
highlight(4, xx, yy, frame[4].rev_vid);
tsrwindow_xy(4, xx - 1, yy - 1);
do
{
    status = move_highlight(4, &xx, &yy);
} while(status != ENTER && status != ESC);
deactivate(4);
```

```c
    goto_xy(old_col, old_row);
if(status == ESC)
    return;
switch(yy)
{
   case 1:
  try_flg = 0;
  break;
   case 2:
   utility();
   break;
   case 3:
   table_routines();
   break;
   case 4:
  restrict(0);
  break;
   case 5:
   restrict(1);
   break;
    }
} char move_highlight(num, x, y)
int num;
int *x, *y;
{
   union inkey
    {
       char ch[2];
       int i;
    }c;

while(!bioskey(1));
   c.i = bioskey(0);
   switch(c.ch[1])
    {
       case UP:
       if(*y > frame[num].starty + 1)
       {
```

```c
            highlight(num, *x, *y, frame[num].norm_vid);
            highlight(num, *x, --*y, frame[num].rev_vid);
            tsrwindow_xy(num, *x - 1, *y - 1);
        }
        break;
        case DN:
        if(*y < frame[num].endy - 1)
        {
            highlight(num, *x, *y, frame[num].norm_vid);
            highlight(num, *x, ++*y, frame[num].rev_vid);
            tsrwindow_xy(num, *x - 1, *y - 1);
        }
        break;
    }
    if(c.ch[0] == ENTER || c.ch[0] == ESC)
        return c.ch[0];
        else
            return 0;
} void highlight(num, x, y, attr)
int num, x, y, attr;
{
    register int i;
    int len;
    unsigned char far *v;

v = vid_mem;
    len = frame[num].endx - frame[num].startx - 1;
    v += (y * 160) + x * 2;
    for(i = 0;i < len; i++)
    {
        *v++;
        *v++ = attr;
    }
} void init_win()
{
    make_tsrwindow(0, "ANTISCRAP", ACS, ARS, ACE, ARE, 1, ANA, ARA);
```

```
    make_tsrwindow(1, "PASSWORD ENTRY", PCS, PRS, PCE, PRE, 1, PNA,
PRA);
    make_tsrwindow(2, "ERROR MESSAGE", ECS, ERS, ECE, ERE, 1, ENA,
ERA);
    make_tsrwindow(3, "CURRENT LOT IDs", CCS, CRS, CCE, CRE, 1, CNA,
CRA);
    make_tsrwindow(4, "MENU", MCS, MRS, MCE, MRE, 1, MNA, MRA);
    make_tsrwindow(5, "TABLE", TCS, TRS, TCE, TRE, 1, TNA, TRA);
    make_tsrwindow(6, "EVENT LIST", LCS, LRS, LCE, LRE, 1, LNA,
LRA);
    establish_field();
}
void establish_field()
{
    init_field(0, strlen(PROMPT1) - 1, 0, msk1, temp, lot_entry);
    init_field(1, strlen(PROMPT2) - 1, 1, msk2, temp, wafer_entry);
    init_field(2, strlen(PROMPT3) - 1, 2, msk3, temp, op_entry);
    init_field(3, strlen(PROMPT4) - 1, 3, msk2, temp, rcp_entry);
    init_field(4, strlen(PROMPT5) - 1, 0, msk4, pw, NULL);
    init_field(5, strlen(PROMPT18), 0, msk2, temp, NULL);
} void init_field(num, col, row, mask, buff, fvalid)
int num, col, row;
char *mask;
char *buff;
int (*fvalid)();
{
    field[num].fmask = mask;
    field[num].fcol = col;
    field[num].frow = row;
    field[num].fbuff = buff;
    field[num].fvalid = fvalid;
} void display_field(num, fn, num_fields)
int num, fn, num_fields;
{
    char *msk;
```

```c
      do
      {
         tsrwindow_xy(num, field[fn].fcol, field[fn].frow);
         msk = field[fn].fmask;
         while(*msk)
         tsrwindow_putchar(num, *msk++);
         ++fn;
      }while(--num_fields > 0);
} void read_field(num, fn, echo)
int num, *fn, echo;
{
   char *msk;
   char *buf, *t_buf;
   int sc;
   int len = 0;
   char c;
   int col, row, t_curx;

tsrwindow_xy(num, field[*fn].fcol, field[*fn].frow);
   msk = field[*fn].fmask;
   buf = field[*fn].fbuff;
   col = field[*fn].fcol;
   row = field[*fn].frow + 1;
   while(*msk)
   {
      cursor(num, frame[num].startx + col + 1,
           frame[num].starty + field[*fn].frow + 1);
      if(!echo || !*(msk+1))
      sc = tsrwindow_getch(num);
      else
      sc = tsrwindow_getche(num);
      c = (char) sc;
      switch(c)
      {
      case TAB:
           frame[num].curx--;
           tsrwindow_putchar(num, *msk);
           frame[num].curx--;
```

```c
      break;
   case BKSP:
      if(buf > field[*fn].fbuff)
      {
         --len;
         --col;
         --msk;
         t_buf = buf;
         t_curx = frame[num].curx;
         do
         {
         *(buf - 1) = *buf;
         --frame[num].curx;
         tsrwindow_putchar(num, *buf);
         if(*buf != NULL)
         {
            buf++;
            frame[num].curx++;
         }
         }while(*buf != NULL);
         *(buf - 1) = NULL;
         --frame[num].curx;
         tsrwindow_putchar(num, *msk);
         buf = t_buf - 1;
         frame[num].curx = --t_curx;
      }
      break;
   case NULL:
      c = (char) (sc >> 8);
      switch(c)
      {
         case UP:
         *buf = NULL;
         if(row + frame[num].starty > frame[num].starty + 1)
         {
            msk = NULL;
            *fn -= 1;
            *field[*fn].fbuff = ' ';
            c = ENTER;
         }
```

```c
        break;
    case DN:
    *buf = NULL;
    if(row + frame[num].starty < frame[num].endy - 1 &&
        *field[*fn].fbuff != NULL)
    {
        msk = NULL;
        c = ENTER;
    }
    else
        if(*field[*fn].fbuff == NULL)
        display_error(5);
    else
        msk = NULL;
    break;
    case LT:
    if(buf > field[*fn].fbuff)
    {
        --col;
        --buf;
        --msk;
        --frame[num].curx;
    }
    break;
    case RT:
    if(len > (col - field[*fn].fcol))
    {
        ++msk;
        ++col;
        ++buf;
        ++frame[num].curx;
    }
    break;
    break;
default:
    msk++;
            if(endstroke(c) || !*msk)
            {
            if(c == ESC)
                *field[*fn].fbuff = c;
```

```
            msk = NULL;
         }
         else
         {
            *buf++ = toupper(c);
            len++;
            *buf = NULL;
            col++;
         }
      }
   }
} void cursor(num, x, y)
int num, x, y;
{
   unsigned char far *v;

v = vid_mem;
   v += (y * 160) + x * 2;
   *v++;
   while(!bioskey(1))
   {
      *v = frame[num].rev_vid;
      delay(150);
      *v = frame[num].norm_vid;
      delay(200);
   }
} int endstroke(c)
int c;
{
   switch(c)
   {
      case ENTER:
      case '\n':
      case '\t':
      case ESC:
         return 1;
      default:
```

```c
        return 0;
    }
} int read_pw(eng_pw, sys_pw)
char eng_pw[], sys_pw[];
{
    int fd, error_flg;
    char *p1, *p2;

p1 = eng_pw;
    p2 = sys_pw;
    if((fd = open("pw.dat", O_RDONLY)) > 0)
    {
        do
        {
        read(fd, p1, 1);
        }while(*p1++ != NULL);
        do
        {
        read(fd, p2, 1);
        }while(*p2++ != NULL);
        close(fd);
        crypt(eng_pw, sys_pw, 1);
        error_flg = 0;
    }
    else
    {
        strcpy(eng_pw, DEFAULT_ENG_PW);
        strcpy(sys_pw, DEFAULT_SYS_PW);
        crypt(eng_pw, sys_pw, 0);
        error_flg = write_pw(eng_pw, sys_pw);
    }
    return error_flg;
} int write_pw(eng_pw, sys_pw)
char eng_pw[];
char sys_pw[];
{
    int fd;
```

```c
    if((fd = open("pw.dat", O_WRONLY | O_CREAT, S_IREAD | S_IWRITE))
> 0)
      {
         write(fd, eng_pw, strlen(eng_pw));
         write(fd, NULL, 1);
         write(fd, sys_pw, strlen(sys_pw));
         write(fd, NULL, 1);
         close(fd);
         return 0;
      }
      else
         return 1;
} void new_pw()
{
   int fd, error_flg;
   int i = 4;
   char eng_pw[MAX_BUF];
   char sys_pw[MAX_BUF];
   char temp[MAX_BUF];

int pw_flg = 0;

cursor_pos();
   tsrwindow(1, NORMAL);
   tsrwindow_cls(1);
   tsrwindow_puts(1, PROMPT6);
   display_field(1, 4, 1);
   read_field(1, &i, OFF);
   error_flg = read_pw(eng_pw, sys_pw);
   if(!error_flg)
   {
      if(strcmp(pw, eng_pw) == 0)
      pw_flg = 1;
      else if(strcmp(pw, sys_pw) == 0)
      pw_flg = 2;
      else
      pw_flg = 3;
      while(pw_flg)
```

```c
{
    tsrwindow_cls(1);
    tsrwindow_puts(1, PROMPT7);
    display_field(1, 4, 1);
    read_field(1, &i, OFF);
    strcpy(temp, pw);
    tsrwindow_cls(1);
    tsrwindow_puts(1, PROMPT8);
    display_field(1, 4, 1);
    read_field(1, &i, OFF);
    if(strcmp(pw, temp) == 0 && pw_flg != 3)
    {
        if(pw_flg == 1)
            strcpy(eng_pw, pw);
        else
            strcpy(sys_pw, pw);
                crypt(eng_pw, sys_pw, 0);
                write_pw(eng_pw, sys_pw);
                pw_flg = 0;
        } else
        {
            display_error(2);
            pw_flg = 0;
        }
    }
    else
        display_error(error_flg);
    deactivate(1);
    goto_xy(old_col, old_row);
} void crypt(eng_pw, sys_pw, md)
char eng_pw[], sys_pw[];
int md;
{
    register int i;
    int len1, len2, value;
```

```
    len1 = strlen(eng_pw);
    len2 = strlen(sys_pw);

if(md == 0)
        value = -31;

else
        value = 31;

for(i = 0;i < len1;i++)
        eng_pw[i] += value;
        for(i = 0;i < len2;i++)
            sys_pw[i] += value;
} void key_fake(ascii_char, scan_code)
int ascii_char, scan_code;
{
    typedef struct
    {
        unsigned char ch ;
        unsigned char sc;
    } keybuf;

unsigned far *begptr;
    unsigned far *endptr;
    keybuf far *keydata;
    unsigned char far *tmp;
    unsigned int newtailptr;

headptr = MK_FP(0x0040, 0x001a);
    tailptr = MK_FP(0x0040, 0x001c);
    begptr = MK_FP(0x0040, 0x0080);
    endptr = MK_FP(0x0040, 0x0082);
    keydata = MK_FP(0x0040, *begptr);
    disable();
    tmp = MK_FP(0x0040, *tailptr);
    newtailptr = *tailptr + 2;
    if(newtailptr >= *endptr)
        newtailptr = *begptr;
```

```c
        *tmp++ = ascii_char;
        *tmp = scan_code;
        *tailptr = newtailptr;
        enable();
}
int menu_dn()
{
    char bf[2];

get_text(MENU_COL, MENU_ROW, MENU_COL, MENU_ROW, bf);
    if(bf[1] == ACTIVE)
        return 1;
    else
        return 0;
} void view_lots()
{
    register int i;

set_vid_mem();
    cursor_pos();
    tsrwindow(3, NORMAL);
    tsrwindow_cls(3);
    for(i = 0;i < lot_counter; i++)
    {
        tsrwindow_puts(3, lot_info[i].lot);
        tsrwindow_putchar(3, '\n');
    }
    tsrwindow_getche(3);
    deactivate(3);
    goto_xy(old_col, old_row);
} void display_error(num)
int num;
{
    char *temp;
    int len, x;

cursor_pos();
```

```c
tsrwindow(2, ACCENT);
tsrwindow_cls(2);
while(bioskey(1))
    tsrwindow_getch(2);
x = frame[2].startx;
switch(num)
{
    case 0:
    temp = "INVALID PASSWORD";
    break;
    case 1:
    temp = "PW FILE READ/WRITE ERROR";
    break;
    case 2:
    temp = "PW VALIDATION ERROR";
    break;
    case 3:
    temp = "SYSTEM UNSECURED";
    break;
    case 4:
    temp = "SYSTEM SECURED";
    break;

case 5:
    temp = "INPUT REQUIRED";
    break;
    case 6:
    temp = "INVALID INPUT";
    break;
    case 7:
    temp = "LOT / WAFER VALIDATION ERROR";
    break;
    case 8:
    temp = "RECIPE VALIDATION ERROR";
    break;
    case 9:
    temp = "INVALID OPERATION";
    break;;
    case 10:
    temp = "UNABLE TO SELECT RECIPE";
```

```
break;
case 11:
temp = "UNABLE TO CONTINUE";
break;
case 12:
temp = "PRESS ANY KEY TO CONTINUE";
break;
case 13:
temp = "CONTACT ENG. TO RESET";
break;
case 14:
temp = "ADDITION ABORTED";
break;
case 15:
temp = "INPUT STRING TO LONG";
break;
case 16:
temp = "ADDITION SUCCESSFUL";
break;
case 17:
temp = "DELETION SUCCESSFUL";
break;
case 18:
temp = "NO MATCH FOUND";
break;
case 19:
temp = "DELETION ABORTED";
break;
case 20:
temp = "TABLE READ/WRITE ERROR";
break;
case 21:
temp = "TABLE EMPTY";
break;
case 22:
temp = "OPERATION MISMATCH";
break;
case 23:
temp = "UNABLE TO OPEN FILE";
break;
```

```c
        case 24:
            temp = "EVENT TYPE NOT FOUND";
            break;
        case 25:
            temp = "CURRENT MODE INVALID";
            break;
        case 26:
            temp = "RUN TERMINATED";
            break;
        case 27:
            temp = "RESTRICTED OPERATION";
            break;
    }
    len = strlen(temp);
    len = (frame[2].endx - x - len) / 2;
    x += len;
    write_string(x, frame[2].starty + 1, temp, frame[2].rev_vid);
    tsrwindow_getch(2);
    deactivate(2);
    goto_xy(old_col, old_row);

} void utility()
{
    char *old_header;
    char code[MAX_CBUF];
    char temp[MAX_LBUF + 4];
register int i, j;
int ii = 0;

cursor_pos();
old_header = frame[0].header;
frame[0].header = "UTILITY";
tsrwindow(0, NORMAL);
tsrwindow_cls(0);
tsrwindow_puts(0, PROMPT1);
tsrwindow_puts(0, PROMPT9);
tsrwindow_puts(0, PROMPT3);
tsrwindow_puts(0, PROMPT10);
```

```c
    display_field (0, 0, 1);
    read_field(0, &ii, ON);
    if(*field[0].fbuff != ESC && *field[0].fbuff != NULL)
    {
        strcpy(lot_info[lot_counter].lot, field[0].fbuff);
        tsrwindow_xy(0, field[1].fcol + 1, field[1].frow);
        field[0].fbuff[7] = NULL;
        figure_checksum(CODE_LEN, field[0].fbuff, code);
        tsrwindow_puts(0, code);
        tsrwindow_xy(0, field[2].fcol, field[2].frow);
        display_field(0,2,1);
        ii = 2;
        read_field(0,&ii, ON);
        if(*field[0].fbuff != ESC && *field[0].fbuff != NULL)
        {
        strcpy (temp, lot_info[lot_counter].lot);
        for(i=strlen(temp), j=2;j < 5;i++, j++)
            temp[i] = *(field[0].fbuff + j);
        temp[i] = NULL;
        figure_checksum(CODE_LEN, temp, code);
        tsrwindow_xy(0, field[3].fcol, field[3].frow);
        tsrwindow_puts(0, code);
        display_error(12);
        }
    }
    deactivate(0);
    goto_xy(old_col, old_row);
    frame[0].header = old_header;
} int validate()
{
    char code_result[MAX_CBUF];
    char lt[MAX_LBUF];

strcpy(lt, lot_info[lot_counter].lot);
    lt[7] = NULL;

figure_checksum(CODE_LEN, lt, code_result);
    if(strcmp(code_result,lot_info[lot_counter].wafer) == 0)
```

```
            return 1;
        else
            return 0;
} int val_rcp()
{
    char temp[MAX_LBUF + 4];
    char code[MAX_CBUF];
    register int i, j;

strcpy (temp, lot_info[lot_counter].lot);
    for(i=strlen(temp), j=2;j < 5;i++, j++)
        temp[i] = *(lot_info[lot_counter].op + j);
    temp[i] = NULL;
    figure_checksum(CODE_LEN, temp, code);
    if(strcmp(code, lot_info[lot_counter].rcp_id) == 0)
        return 1;
    else
        return 0;
} int lot_entry()
{
    int loc;

if(search_table(2, &loc, field[0].fbuff))
    {
        if(lot_counter == 0)
        {
        strcpy(lot_info[lot_counter].lot, field[0].fbuff);
        strcpy(field[2].fbuff, table[loc].op);
        op_entry();
        lot_counter++;
        return 2;
        }
    }
    else if(strcmp("LEAKCHECK",field[0].fbuff) == 0)
    {
        strcpy(lot_info[lot_counter].lot, field[0].fbuff);
```

```c
      strcpy(lot_info[0].op, "0000");
      lock_flg = 0;
      mode = 2;
      return 6;
   }
   strcpy(lot_info[lot_counter].lot, field[0].fbuff);
   if(lot_counter == 0 && strcmp("TEST", lot_info[lot_counter].lot) == 0)
   {
      lot_counter++;
      lock_flg = 0;
      return 7;
   } return 1;
}
int wafer_entry()
{
   strcpy(lot_info[lot_counter].wafer, field[1].fbuff);
   if(!validate())
   {
      display_error(7);
      display_field(0,0,2);
      try_flg++;
      return 3;
   }
   return 1;
} int op_entry()
{
   int loc;

strcpy(lot_info[lot_counter].op, field[2].fbuff);
   if(!search_table(1, &loc, lot_info[lot_counter].op))
   {
      display_error(9);
      display_field(0,2,1);
      try_flg++;
      return 0;
```

```c
   }
   if(table[loc].restrict_flg)
   {
      display_error(27);
      display_field(0,2,1);
      try_flg++;
      return 0;
   }
   if((lot_counter != 0) && ((strcmp(recipe1_name, table[loc].rcp1)
!= 0)
      || ((mode == 1) && (strcmp(recipe2_name, table[loc].rcp2) !=
0))))
   {
      display_error(22);
      return 5;
   }
   strcpy(recipe1_name, table[loc].rcp1);
   strcpy(recipe2_name, table[loc].rcp2);
   mode = table[loc].mode;
   return 1;
} int rcp_entry()
{
   strcpy(lot_info[lot_counter].rcp_id, field[3].fbuff);
   if(!val_rcp())
   {
      display_error(8);
      display_field(0,3,1);
      try_flg++;
      return 4;
   }
   return 1;
} void sequence_keys(int chgflg)
{
   sex = 2;

if(chgflg)
```

```c
{
    key_fake(NULL, ALT_R);
    key_fake(NULL, F2);
}
key_fake(NULL, F10);
key_fake(NULL, ALT_S);
if(chgflg)
{
    key_fake(NULL, PGDN);
    key_fake(0x0d, 0x1c);
    key_fake(0x31, 0x02);
}
key_fake(NULL, CURS_DN);
key_fake(NULL, CURS_DN);
key_fake(0x0d, 0x1c);
} void select_rcp()
{
    char far *v, far *t;
    char *p;
    char buf[MAX_BUF];
    register int i;
    int correction_factor = 0;
    int row, col, cp, done;
    int kbval, match, multi = 0;

set_vid_mem();
    v = vid_mem;
    if(vid_mem == (char far *) 0xB0000000)
        correction_factor = 1;
    col = RCOL;
    row = RROW;
    done = 0;
    cp = 0;
    do
    {
        p = buf;
        i = col;
```

```
if(sex == 5)
multi = 1;
t = (v + (row *160) + (i + correction_factor) * 2);
while((valid_char(*t)) || (*t == ' ' && valid_char(*(t+2))))
&&
        (i < col + MAX_BUF))
    {
        *p++ = toupper(*t);
        t = (v + (row *160) + (++i + correction_factor) * 2);
    }
    *p = NULL;
    if(p != buf)
    {
    if(sex == 2 || sex == 5)
        match = strcmp(buf, recipe1_name);
    else
        match = strcmp(buf, recipe2_name);

if(match != 0)
    {
        if(row < LAST_ROW)
        {
            row += 2;
            cp++;
        }
        else
            if((*(t=(v+(RROW*160)+(PGUP_COL*2) +1))) == (char) 120)
            {
            sex = done = 2;
            for(i=0;i<6;i++)
                key_fake(NULL, PGUP);
            }
            else
            {
            display_error(10);
            done = 1;
            sex = 0;
            key_fake(NULL, END);
            }
    }
```

```
        else
        {
           done = 1;
           sex = 0;
           for(i=0;i<cp;i++)
              key_fake(NULL, CURS_DN);
           key_fake(0x0d, 0x1c);
           if(!multi)
           {
              key_fake(NULL, END);
              lock_flg = 0;
           }
        }
     }
     else
     {
     display_error(10);
     done = 1;
     sex = 0;
     }
  }while(!done);
  if(multi == 1)
     sex = 6;
  if(sex == 0)
     datalog = 1;
} void get_mode()
{
   *tailptr = *headptr;
   cm = current_mode();

get_wc();

if(cm != mode)
   {
   if(cm == 3)
   {
   display_error(25);
   sex = 0;
```

```
        lot_counter = 0;
        return;
        }
    } else if(mode == 0)
    {
        sequence_keys(0);
        return;
    }
    sex = 10;
    key_fake(NULL, F4);
} void setup()
{
    *tailptr = *headptr;
    if(!menu_dn())
    {
        sex = 10;
        key_fake(NULL, F10);
        return;
    }
    if(!r_active())
        key_fake(NULL, ALT_R);
    if((cm != 1 && mode == 1) || (cm == 1 && mode != 1))
        key_fake(NULL, ALT_U);
    else if(cm == 2 && mode == 0)
    {
        key_fake(NULL, ALT_U);
        key_fake(NULL, ALT_U);
        key_fake(NULL, F10);
    }
    if(mode == 0)
        sequence_keys(1);
    else
        multi1();
} int current_mode()
```

```c
{
    char bf[2];

get_text(MODE_COL, MODE_ROW, MODE_COL, MODE_ROW, bf);
    if(bf[0] == MULTILAYER)
        return 1;
    else if(bf[0] == LKCK)
        return 2;
    else
    {
        get_text(MODE_COL + MODE_OFFSET, MODE_ROW, MODE_COL + MODE_OFFSET,
            MODE_ROW, bf);
        if(bf[0] == 'R' || bf[0] == 'P' || bf[0] == 'C')
            return 3;
    }
    return 0;
} void multi1()
{
    ccx - 4;
    key_fake(NULL, PGUP);
    key_fake(0x0d, 0x1c);
    key_fake(0x31, 0x02);
    key_fake(0x0d, 0x1c);
    key_fake(ascii_scan[wc_1[0] - 48][0], ascii_scan[wc_1[0] - 48][1]);
    if(wc_1[2] != ' ')
        key_fake(ascii_scan[wc_1[2] - 48][0], ascii_scan[wc_1[2] - 48][1]);
    key_fake(0x0d, 0x1c);
    key_fake(0x32, 0x03);
    key_fake(0x0d, 0x1c);
} void multi2()
{
    *tailptr = *headptr;
```

```
    key_fake(ascii_scan[wc_2[0] - 48][0], ascii_scan[wc_2[0] -
48][1]);
    if(wc_2[2] != ' ')
        key_fake(ascii_scan[wc_2[2] - 48][0], ascii_scan[wc_2[2] -
48][1]);
    key_fake(0x0d, 0x1c);
    key_fake(NULL, END);
    key_fake(NULL, ALT_R);
    key_fake(NULL, F2);
    key_fake(NULL, F10);
    key_fake(NULL, ALT_S);
    key_fake(NULL, CURS_RT);
    key_fake(0x32, 0x03);
    key_fake(NULL, CURS_DN);
    key_fake(NULL, CURS_DN);
    key_fake(0x0d, 0x1c);
} void setup_rcp2()
{
    *tailptr = *headptr;
    sex = 7;
    key_fake(NULL, PGUP);
    key_fake(NULL, CURS_DN);
    key_fake(NULL, CURS_DN);
    key_fake(0x0d, 0x1c);
} void lkck()
{
    *tailptr = *headptr;
    if(!menu_dn())
    {
        sex = 11;
        key_fake(NULL, F10);
        return;
    }
    if(!c_active())
        key_fake(NULL, ALT_C);
```

```c
    if(cm == 2)
        key_fake(NULL, ALT_L);
    key_fake(NULL, ALT_L);
    sex = 0;
} int is_idle()
{
    char buf[11], temp[6];
    int i, j;

get_text(REACTOR_COL, REACTOR_ROW, REACTOR_COL + 5, REACTOR_ROW, buf);
    for(i = j = 0;i < 4;i++, j += 2)
        temp[i] = toupper(buf[j]);
    temp[i] = NULL;
    if(strcmp("IDLE", temp) == 0)
        return 1;
    else
        sex = 9;
    return 0;
} void get_wc()
{ get_text(WC1, WCR, WC1 + 1, WCR, wc_1);

if(wc_1[0] < '0' || wc_1[0] > '9')
    {
        get_text(WC1, WCR + 2, WC1 + 1, WCR + 2, wc_1);
        get_text(WC2, WCR + 2, WC2 + 1, WCR + 2, wc_2);
        get_text(WC3, WCR + 2, WC3 + 1, WCR + 2, wc_3);
    } else
    {
        get_text(WC2, WCR, WC2 + 1, WCR, wc_2);
        get_text(WC3, WCR, WC3 + 1, WCR, wc_3);
    }
```

```c
} int r_active()
{
    char bf[2];

get_text(MENU_COL, REACT_ROW, MENU_COL, REACT_ROW, bf);
    if(bf[1] == ACTIVE)
        return 1;
    else
        return 0;
} int c_active()
{
    char bf[2];

get_text(MENU_COL, CALIB_ROW, MENU_COL, CALIB_ROW, bf);
    if(bf[1] == ACTIVE)
        return 1;
    else
        return 0;
} void table_routines()
{
    char status;
    int xx, yy;

cursor_pos();
    xx = frame[5].startx + 1;
    yy = frame[5].starty + 1;
    tsrwindow(5, NORMAL);
    tsrwindow_cls(5);
    tsrwindow_puts(5, "READ\n");
    tsrwindow_puts(5, "WRITE\n");
    tsrwindow_puts(5, "ADD\n");
    tsrwindow_puts(5, "DELETE\n");
    tsrwindow_puts(5, "VIEW\n");
    highlight(5, xx, yy, frame[5].rev_vid);
```

```c
   tsrwindow_xy(5, xx - 1, yy - 1);
   do
   {
      status = move_highlight(5, &xx, &yy);
   } while(status != ENTER && status != ESC);
   deactivate(5);
   goto_xy(old_col, old_row);
   if(status == ESC)
      return;
   switch(yy - 5)
   {
         case 1:
         read_table();
         break;
         case 2:
         write_table();
         break;
         case 3:
      add_to_table();
      break;
         case 4:
         delete_from_table();
         break;
         case 5:
         view_table();
         break;
      }
} void view_table()
{
   register int j, i, x;
   char *old_header, ch;

if(table_count == 0)
   {
      display_error(21);
      return;
   }
   cursor_pos();
```

```c
old_header = frame[3].header;
frame[3].header = "VIEW TABLE";
tsrwindow(3, NORMAL);
j = table_count;
x = 3;
do
{
      tsrwindow_cls(3);

for(i = x - 3;i < x && i < j; i++)
      {
      if(table[i].restrict_flg)
          write_string(frame[3].curx + frame[3].startx + 1, frame[3].cury +
                 frame[3].starty + 1, table[i].op, frame[3].rev_vid);
      else
          tsrwindow_puts(3, table[i].op);
      tsrwindow_putchar(3, '\n');
      tsrwindow_puts(3, table[i].rcp1);
      tsrwindow_putchar(3, '\n');
      tsrwindow_puts(3, table[i].rcp2);
      tsrwindow_puts(3, "\n\n");
      } x += 3;
      if((ch = tsrwindow_getch(3)) == ESC)
      break;
   }while(i < j);
   deactivate(3);
   goto_xy(old_col, old_row);
   frame[3].header = old_header;
} void read_table()
{
   int fd, rc;
   int flg = 2;
   char *t1, *h1, temp[2];
```

```
table_count = 0;
if((fd = open("rtable.dat", O_RDONLY | O_TEXT)) > 0)
{
   h1 = table[table_count].op;
   do
   {
   t1 = h1;
   do
   {
     rc = read(fd, t1, 1);
   }while(*t1++ != NULL);
   if(*h1 != NULL)
   {
      switch(flg)
      {
         case 0:
         flg++;
         if(strcmp(table[table_count].rcp2, NO_RCP) == 0)
             table[table_count].mode = 0;
         else
             table[table_count].mode = 1;
         h1 = temp;
         break;
         case 1:
         flg++;
         if(*h1 == '@')
            table[table_count].restrict_flg = 1;
         else
            table[table_count].restrict_flg = 0;
         table_count++;
         h1 = table[table_count].op;
         break;
         case 2:
         flg++;
         h1 = table[table_count].rcp1;
         break;
         case 3:
         flg = 0;

h1 = table[table_count].rcp2;
            break;
```

```
            }
         }while(rc > 0);
         close(fd);
      }
      else
         display_error(20);
} void write_table()
{
   int fd, j;

if((fd = open("rtable.dat",O_CREAT | O_TRUNC | O_WRONLY | O_TEXT,
            S_IREAD | S_IWRITE)) > 0)
   {
      for(j = 0;j < table_count; j++)
      {
      write(fd, table[j].op, strlen(table[j].op));
      write(fd, NULL, 1);
      write(fd, table[j].rcp1, strlen(table[j].rcp1));
      write(fd, NULL, 1);
      write(fd, table[j].rcp2, strlen(table[j].rcp2));
      write(fd, NULL, 1);
      if(table[j].restrict_flg)
         write(fd, "@", 1);
      else
         write(fd, "#", 1);
      write(fd, NULL, 1);
      }
      close(fd);
   }
   else
      display_error(20);
} void add_to_table()
{
   int i = 4;
   int pass;
```

```c
int tc = table_count;
char *old_header;

if(table_count == 0)
   display_error(21);
cursor_pos();
old_header = frame[1].header;
frame[1].header = "ADD TO TABLE";
tsrwindow(1, NORMAL);
do
{
   pass = 1;
   tsrwindow_cls(1);
   tsrwindow_puts(1, PROMPT14);
   display_field(1, 4, 1);
   read_field(1, &i, ON);
   if(*field[4].fbuff != ESC && *field[4].fbuff != NULL)
   {
   if(strlen(field[4].fbuff) < MAX_OBUF)
   {
      strcpy(table[table_count].op, field[4].fbuff);
      while(pass != 0)
      {
         tsrwindow_cls(1);
         if(pass == 1)
         tsrwindow_puts(1, PROMPT11);
         else
         tsrwindow_puts(1, PROMPT16);
         display_field(1, 4, 1);
         read_field(1, &i, ON);
if(*field[4].fbuff != ESC && *field[4].fbuff != NULL)
{
if(strlen(field[4].fbuff) < MAX_BUF)
{
   if(pass == 1)
   {
   strcpy(table[table_count].rcp1, field[4].fbuff);
   table[table_count].restrict_flg = 0;
   tsrwindow_cls(1);
   tsrwindow_puts(1, PROMPT17);
```

```c
        if(toupper(tsrwindow_getche(1)) == 'Y')
        {
            table[table_count].mode = 1;
            pass++;
        }
        else
        {
            pass = 0;
            table[table_count].mode = 0;
            strcpy(table[table_count].rcp2, NO_RCP);
            table_count++;
        }
        }
        else
        {
        strcpy(table[table_count].rcp2, field[4].fbuff);
        pass = 0;
        table_count++;
        }
    }
    else
        display_error(15);
    }
    else
    {
    pass = 0;
            display_error(14);
            }
        }
    }
    else
        display_error(15);
    }
    else
    display_error(14);
    tsrwindow_cls(1);
    tsrwindow_puts(1, PROMPT15);
}while(toupper(tsrwindow_getche(1)) == 'Y');
deactivate(1);
goto_xy(old_col, old_row);
if(tc < table_count)
```

```c
        {
            write_table();
            display_error(16);
        }
        frame[1].header = old_header;
} void delete_from_table()
{
    char c, *old_header;
    int i = 4;
    int loc, flg;

cursor_pos();
    old_header = frame[1].header;
    frame[1].header = "DELETE FROM TABLE";
    tsrwindow(1, NORMAL);
    tsrwindow_cls(1);
    tsrwindow_puts(1, PROMPT12);
    if((c = toupper(tsrwindow_getche(1))) == 'Y')
    {
    tsrwindow_cls(1);
    tsrwindow_puts(1, PROMPT14);
    display_field(1, 4, 1);
    read_field(1, &i, ON);
    flg = 1;
}
else
{
    tsrwindow_cls(1);
    tsrwindow_puts(1, PROMPT13);
    if((c = toupper(tsrwindow_getche(1))) == 'Y')
    {
    tsrwindow_cls(1);
    tsrwindow_puts(1, PROMPT11);
    display_field(1, 4, 1);
    read_field(1, &i, ON);
    flg = 2;
    }
}
```

```
   if(c == 'Y')
   {
      if(*field[4].fbuff != ESC && *field[4].fbuff != NULL)
      {
      if(search_table(flg, &loc, field[4].fbuff))
      {
         --table_count;
         for(; loc < table_count; loc++)
         {
            strcpy(table[loc].op, table[loc+1].op);
            strcpy(table[loc].rcp1, table[loc+1].rcp1);
            strcpy(table[loc].rcp2, table[loc+1].rcp2);
            table[loc].mode = table[loc+1].mode;
            table[loc].restrict_flg = table[loc+1].restrict_flg;
         }
         write_table();
         display_error(17);
         }
         else
            display_error(18);
      }
      else
      display_error(19);
   }
   frame[1].header = old_header;
   deactivate(1);
   goto_xy(old_col, old_row);
} int search_table(md, loc, str)
int md, *loc;
char *str;
{
   char *t1, *t2, *s1;
   int done = 0;

for(*loc = 0;*loc < table_count && !done;*loc += 1)
   {
      if(md == 1)
      {
```

```
        s1 = str + 2;

t1 = table[*loc].op;
        if(strstr(t1, s1) != NULL)
            done = 1;
        }
        else
        {
        t1 = table[*loc].rcp1;
        t2 = table[*loc].rcp2;
        if((strcmp(strupr(t1), str) == 0) || (strcmp(strupr(t2), str)
 == 0))
            done = 1;
        }
    }
    if(done)
    {
        *loc -= 1;
        return 1;
    }
    else
        return 0;
} void restrict(flg)
int flg;
{
    char *oldheader;
    int num, i = 4;

oldheader = frame[1].header;
    if(!flg)
        frame[1].header = "RESTRICT RECIPE";
    else
        frame[1].header = "UNRESTRICT RECIPE";
    *field[4].fbuff = NULL;
    tsrwindow(1, NORMAL);
    tsrwindow_cls(1);
    display_field(1, 4, 1);
    read_field(1, &i, ON);
    deactivate(1);
```

```c
if(*field[4].fbuff != ESC)
{
   if(search_table(1, &num, field[4].fbuff))
   {
   if(!flg)
      table[num].restrict_flg = 1;
   else
      table[num].restrict_flg = 0;
      write_table();
      }
      else
      display_error(18);
   }
   goto_xy(old_col, old_row);
   frame[1].header = oldheader;
} void data_log()
{
   int fd, i, j, numchr;
   char *tm, name[DLEN * 2 + 1], temp[DLEN + 1];
   long tim;
   char tp1[3], tp2[3], tp3[3];

if((fd = open(logfile, O_CREAT | O_APPEND | O_WRONLY | O_TEXT,
         S_IREAD | S_IWRITE)) > 0)
   {
      if(filelength(fd) > 1000000L)
      {
      close(fd);
      if(strcmp(logfile, "tsr1.log") == 0)
         strcpy(logfile, "tsr2.log");
      else
         strcpy(logfile, "tsr1.log");
      if((fd = open(logfile, O_CREAT | O_TRUNC | O_WRONLY | O_TEXT,
          S_IREAD | S_IWRITE)) < 0)
      {
         display_error(23);
         return;
      }
      }
```

```c
time(&tim);
tm = ctime(&tim);
write(fd, "DATE: ", 6);
for(i = 0;i < 10;i++)
write(fd, &*(tm + i), 1);
write(fd, ",", 1);
for(i = 19;i < 24;i++)
write(fd, &*(tm + i), 1);
write(fd, "      ", 3);
write(fd,"\n",1);
write(fd, "TIME: ", 6);
for(i = 11;i < 19;i++)
write(fd, &*(tm + i), 1);
write(fd, "           ",11);
write(fd,"\n                         ",26);
if(strcmp("TEST", lot_info[0].lot) == 0)
write(fd, "\nTEST RUN                 ",26);
else if(strcmp("LEAKCHECK", lot_info[0].lot) == 0)
write(fd, "\nLEAKCHECK                ",26);

else
{
write(fd,"\nLOT NUMBER    OPERATION  \n",27);
for(i = 0;i < lot_counter;i++)
{
   write(fd, lot_info[i].lot, strlen(lot_info[i].lot));

numchr = strlen(lot_info[i].lot);
   for(j = 14 - numchr;j >= 0;j--)
      write(fd, " ",1);
   j = strlen(lot_info[i].op);
   write(fd, lot_info[i].op, j);
   numchr = 13 + j;
   for(j=numchr;j<23;j++)
      write(fd, " ", 1);
   write(fd,"\n",1);
} write(fd,"                         ",25);
```

```
    for(i=j=0;i<5;i+=2, j++)
    {
        tp1[j] = wc_1[i];
        tp2[j] = wc_2[i];
        tp3[j] = wc_3[i];
    }
    write(fd, "\nCASSETTE 1: ", 13);
    write(fd, tp1, 2);
    for(i=12;i < 23;i++)
        write(fd, " ",1);
    write(fd, "\nCASSETTE 2: ", 13);
    write(fd, tp2, 2);
    for(i=12;i < 23;i++)
        write(fd, " ",1);
    write(fd, "\nCASSETTE 3: ", 13);
    write(fd, tp3, 2);
    for(i=12;i < 23;i++)
        write(fd, " ",1);
    write(fd,"\n                          ",26);
    if(mode == 1)
    {
        write(fd,"\nDEPOSIT: ",10);
        numchr = strlen(recipe1_name);
        write(fd, recipe1_name, strlen(recipe1_name));
        for(i=9+numchr;i < 25;i++)
            write(fd, " ",1);
    }
    get_text(DCOL, DROW, DCOL + DLEN, DROW, name);
    write(fd,"\nDEPOSIT: ",10);
    j = DLEN * 2;
    for(i = 0;valid_char(name[i]) || (name[i] == ' ' && i < j);i += 2)
    {
        temp[i/2] = name[i];
        write(fd, &name[i], 1);
    }
    temp[i/2] = NULL;
    numchr = strlen(temp);
    for(i = 9+numchr;i < 25;i++)
        write(fd, " ",1);
```

```c
        }
        write(fd,"\n***********************\n",27);
        close(fd);
    }
} void view_datalog()
{
    int fd, oldendx, oldvid, cr, numbytes;
    char *oldheader, ch;
    long oldpos, fpos;
    union inkey
    {
        char ch[2];
        int i;
    }c;

set_vid_mem();
    cursor_pos();
    if((fd = open(logfile,O_RDONLY)) < 0)
        display_error(23);
    else
    {
        oldheader = frame[6].header;
        oldendx = frame[6].endx;
        oldvid = frame[6].norm_vid;
        frame[6].norm_vid = frame[6].rev_vid;
        frame[6].rev_vid = oldvid;
        frame[6].header = "DATA LOG";
        frame[6].endx = DCE;
        tsrwindow(6, NORMAL);
        tsrwindow_cls(6);
        do
        {
        oldpos = tell(fd);
        cr = 0;
        tsrwindow_xy(6,0,0);
        do
        {
            if((numbytes = (read(fd, &ch, 1))) == 0)
                break;
```

```
            tsrwindow_putchar(6, ch);
            if(ch == '\n')
                cr++;
    } while(numbytes && cr < 19);
    c.i = tsrwindow_getch(6);
    tsrwindow_cls(6);
    switch(c.ch[1])
    {
        case 71:
            lseek(fd, 0L, SEEK_SET);
             break;
        case 72:
            fpos = oldpos - 27L;
            if(fpos < 0L)
            fpos = 0L;
            lseek(fd, fpos, SEEK_SET);
            break;
        case 73:
            fpos = oldpos - (long) 19 * 2';
            if(fpos < 0L)
            fpos = 0L;
            lseek(fd, fpos, SEEK_SET);
            break;
        case 80:
            if(!eof(fd))
            {
            fpos =oldpos + 27L;
             lseek(fd, fpos, SEEK_SET);
            }
            else
            lseek(fd, - (long) 19 * 27, SEEK_END);
            break;
        case 81:
            break;
        case 79:
            lseek(fd, -(long) 16 * 27, SEEK_END);
            break;
    }
}while(c.ch[0] != (char)27);
close(fd);
```

```c
            deactivate(6);
            goto_xy(old_col, old_row);
            frame[6].header = oldheader;
            frame[6].endx = oldendx;
            frame[6].rev_vid = frame[6].norm_vid;
            frame[6].norm_vid = oldvid;
        }
    } void event_list()
    {
        char *oldheader;
        int i = 0;
        int fd, numbytes, cr, match = 0;
        char ch, buf[5];
        long oldpos, fpos;
        union inkey
        {
            char ch[2];
            int i;
        }c;

set_vid_mem();
    oldheader = frame[1].header;
    frame[1].header = "EVENT ENTRY";
    cursor_pos();
    *field[5].fbuff = NULL;
    tsrwindow(1, NORMAL);
    tsrwindow_cls(1);
    tsrwindow_puts(1, PROMPT18);
    display_field(1, 5, 1);
    read_field(1, &i, ON);
    deactivate(1);
    if(*field[5].fbuff != ESC)
    {
        field[5].fbuff[0] = '0';
        tsrwindow(6, NORMAL);
        tsrwindow_cls(6);
        buf[4] = NULL;
        if((fd = open("error.lst", O_RDONLY)) < 0)
```

```c
    display_error(23);
else
{
{
   tsrwindow_puts(6, "Please wait... Searching");
   do
   {
      oldpos = tell(fd);

numbytes = read(fd, buf, 4);
      if(strcmp(buf, field[5].fbuff) .= 0)
      {
      fpos = oldpos + (long) 65;
      lseek(fd, fpos, SEEK_SET);
      } else
      match = 1;
   } while(!match && numbytes);
   tsrwindow_cls(6);
   if(match)
   {
      write_string(4, 3, buf, ((7)|(0<<4)|(128)));
      tsrwindow_xy(6, 4, 0);
   }
   else
   {
      display_error(24);
      lseek(fd, 0L, SEEK_SET);
   }
}
do
{
   cr = 0;
   oldpos = tell(fd);
   if(!match)
      tsrwindow_xy(6, 0, 0);
   match = 0;
   do
   {
```

```c
      numbytes = read(fd, &ch, 1);
      tsrwindow_putchar(6, ch);
      if(ch == '\n')
      cr++;
   } while(numbytes && cr < 19);
   c.i = tsrwindow_getch(6);
   tsrwindow_cls(6);
   switch(c.ch[1])
   {
     case 71:
     lseek(fd, 0L, SEEK_SET);
     break;
     case 72:
     fpos = oldpos - 65L;
     if(fpos < 0L)
        fpos = 0L;
     lseek(fd, fpos, SEEK_SET);
     break;
     case 73:
     fpos = oldpos - (long) 19*65;
     if(fpos < 0L)
        fpos = 0L;
     lseek(fd, fpos, SEEK_SET);
     break;
     case 80:
     if(!eof(fd))
      {
         fpos =oldpos + 65L;
         lseek(fd, fpos, SEEK_SET);
      }
      else
         lseek(fd, - (long) 19 * 65, SEEK_END);
      break;
     case 81:
     break;
     case 79:
     lseek(fd, -(long) 18 * 65, SEEK_END);
     break;
   }
```

```
            }while(c.ch[0] != (char)27);
            close(fd);
            }
        deactivate(6);
    }
    goto_xy(old_col, old_row);
    frame[1].header = oldheader;
} int char_to_ascii(char c1)
{
    return (short int)c1;
} long Cdiv(long x1,long x2)
{
    return (long)(x1/x2);
} long Cmod(long x1,long x2)
{
    return (long)(x1-x2*Cdiv(x1,x2));
} void format_str(int chknum,long value,char *numstr)
{
    int mask;
    char clist[30],codestr[5];

strcpy(clist,"ABCDEFGHIJKLMNOPQRSTUVWXYZ ");
    strcpy(codestr,"    ");
    for (mask=chknum;mask>=1;mask--)
    {
        codestr[mask-1]=clist[Cmod(value,26)];
        value=Cdiv(value,26);
    }
    strcpy(numstr,codestr);
    *(numstr+chknum)='\0';
}
```

```
void shift_it(long *new_value,long *lot_value)
{
   int feed1,feed2,code_pos;
   long fourval,sixteenval;

for (code_pos=1;code_pos<=16;code_pos++)
   {
      fourval=*new_value & 256;
      if (((*new_value & 64)^Cdiv(fourval,4))>0)
      feed1=1;
      else
      feed1=0;
      sixteenval=*new_value & 32768;
      if (((*new_value & 2048)^Cdiv(sixteenval,16))<=0)
      feed2=0;
      else
      feed2=1;
      *new_value=(*new_value+*new_value)+(feed1^feed2)^(*lot_value
& 1);
      *lot_value=Cdiv(*lot_value,2);
   }
} void process_it(char *lotnum,long *new_value)
{
   int str_pos,blank;
   long tmp_value,str_value;

*new_value=0;
   blank=strlen(lotnum)+1;
   if (blank > 1)
   {
      str_pos=1;
      while (str_pos < blank)
      {
      if (str_pos+1 != blank)
         tmp_value=((char_to_ascii(*(lotnum+str_pos))) & 255)*256;
      else
         tmp_value=512;
      str_value=((char_to_ascii(*(lotnum+str_pos-1))) &
```

```
255)+tmp_value;
            shift_it(new_value,&str_value);
            *new_value=*new_value & 16777215;
            str_pos=str_pos+2;
         }
      }
} void figure_checksum(int howmany,char lotnum[],char *code)
{
    long new_value;
    char spacechar[12];

new_value=0;
    if (Cmod(strlen(lotnum),2)==1)
    {
       strcpy(spacechar," ");
       strcat(spacechar,lotnum);
       strcpy(lotnum,spacechar);
    }
    strcpy(code,"");
    process_it(lotnum,&new_value);
    format_str(howmany,new_value,code);
}
#ifndef __WIN_H
#define __WIN_H
#endif
#define MAX_FRAME 7
#define BORDER 1
#define REV_VID 0x70
#define NORM_VID 7
#define ENTER '\r'
#define ESC '\x1B'
#define BKSP 8
#define TAB 9
#define VID_SIZE 3000
#define STK_SIZE 0X2000
#define NORMAL 0
#define ACCENT 128
#define UP 72
```

```c
#define DN 80
#define LT 75
#define RT 77
#define HIDE 1
#define UNHIDE 0
void save_video(int), restore_video(int);
void write_string(int, int, char *, int);
void write_char(int, int, char, int);
void display_header(int, int), draw_border(int);
void tsrwindow_gets(int, char *);
void tsrwindow_cleol(int), tsrwindow(int, int);
void tsrwindow_cls(int), set_vid_mem(void);
void deactivate(int), cursor_pos(void), goto_xy(int, int);
int make_tsrwindow(int, char *, int, int, int, int, int, int, int);
int tsrwindow_xy(int, int, int);
int tsrwindow_puts(int, char *);
int video_mode(void), tsrwindow_putchar(int, char);
int tsrwindow_getche(int), tsrwindow_getch(int);
void read_at_cursor(char *);
struct window_frame
{
   int startx, endx, starty, endy;
   int curx, cury;
   unsigned char *ptr;
   char *header;
   int border;
   int active;
   int norm_vid;
   int rev_vid;
};

#ifndef __NVL_H
#define __NVL_H
#endif
#define F1      59
#define F2      60
#define F3      61
#define F4      62
#define F5      63
#define F6      64
```

```
#define F7        65
#define F8        66
#define F9        67
#define F10       68
#define END       79
#define ALT_W     17
#define ALT_R     19
#define ALT_U     22
#define ALT_S     31
#define ALT_D     32
#define ALT_H     35
#define ALT_L     38
#define ALT_Z     44
#define ALT_C     46
#define CURS_RT   77
#define CURS_DN   80
#define PGUP      73
#define PGDN      81
#define SYS_TIMER 8
#define KEYBD     9
#define TIMER     0x1C
#define DISK      0x13
#define VIDEO     0x10
#define INT28     0x28
#define CRIT      0x24
#define CTRLC     0x23
#define CTRLBRK   0x1B
#define ACS       20
#define ACE       54
#define ARS       8
#define ARE       13
#define ANA       ((0)|(3<<4)|(0))
#define ARA       ((3)|(0<<4)|(0))
#define PCS       10
#define PCE       48
#define PRS       9
#define PRE       11
#define PNA       ((5)|(7<<4)|(0))
#define PRA       ((7)|(5<<4)|(0))
#define ECS       20
```

```
#define ECE      50
#define ERS      5
#define ERE      7
#define ENA      ((4)|(7<<4)|(0))
#define ERA      ((7)|(4<<4)|(0))
#define CCS      59
#define CCE      79
#define CRS      1
#define CRE      13
#define CNA      ((7)|(0<<4)|(0))
#define CRA      ((0)|(7<<4)|(0))
#define MCS      0
#define MCE      11
#define MRS      0
#define MRE      6
#define MNA      ((2)|(0<<4)|(0))
#define MRA      ((0)|(2<<4)|(0))
#define TCS      11
#define TCE      21
#define TRS      5
#define TRE      11
#define TNA      ((0)|(7<<4)|(0))
#define TRA      ((7)|(0<<4)|(0))
#define LCS      3
#define LRS      2
#define LCE      70
#define LRE      22
#define LNA      ((0)|(7<<4)|(0))

#define LRA      ((7)|(0<<4)|(0))
#define DCE      33
#define DCOL     15
#define DROW     10
#define DLEN     8
#define WC1      30
#define WC2      39
#define WC3      48
#define WCR      16
#define PROMPT1  "Enter Lot Number: \n"
#define PROMPT2  "Enter Wafer Code: \n"
#define PROMPT3  "Enter Operation Number: \n"
```

```
#define PROMPT4  "Enter Recipe Code:  \n"
#define PROMPT5  "Enter Password:     \n"
#define PROMPT6  "Enter Old Password: \n"
#define PROMPT7  "Enter NEW Password: \n"
#define PROMPT8  "Re-enter NEW Pw:    \n"
#define PROMPT9  "The wafer code is:  \n"
#define PROMPT10 "The Recipe code is:\n"
#define PROMPT11 "Enter recipe name: "
#define PROMPT12 "Delete by operation number? (Y/N)"
#define PROMPT13 "Delete by recipe name? (Y/N)"
#define PROMPT14 "Enter Operation: "
#define PROMPT15 "Add Another (Y/N)"
#define PROMPT16 "Enter 2nd recipe: "
#define PROMPT17 "Is this a multilayer op? (Y/N)"
#define PROMPT18 "Enter Event Type: "
#define ON 1
#define OFF 0
#define MAX_FIELD 6
#define MAX_BUF 15
#define MAX_LOTS 10
#define MAX_TABLE 20
#define DEFAULT_ENG_PW "NVL"
#define DEFAULT_SYS_PW "CONCEPT1"
#define NULL '\x0'
#define MAX_CBUF 5
#define MAX_OBUF 6
#define MAX_LBUF 11
#define CODE_LEN 4
#define RCOL 29
#define RROW 5
#define PGUP_COL 57
#define LAST_ROW 15
#define MODE_COL 53
#define MODE_ROW 2
#define MODE_OFFSET 2
#define MULTILAYER 'M'
#define LKCK 'L'
#define MENU_COL 68
#define MENU_ROW 2
#define CALIB_ROW 9
```

```
#define REACT_ROW 12
#define ACTIVE (char)113
#define REACTOR_COL 65
#define REACTOR_ROW 6
#define NO_RCP "**********"
#define DELAY1 200
#define DELAY2 2000
#define DELAY3 40000
struct data_field
{
    char *fmask;
    char *fbuff;
    int frow;
    int fcol;
    int (*fvalid)();
};

struct rcp_table
{
    char op[MAX_OBUF];
    char rcp1[MAX_BUF];
    char rcp2[MAX_BUF];
    int mode;
    int restrict_flg;
};

struct buffers
{
    char lot[MAX_LBUF];
    char wafer[MAX_CBUF];
    char op[MAX_OBUF];
    char rcp_id[MAX_CBUF];
};
```

We claim:

1. A method for adding a control function to a semiconductor system having a processor coupled to a memory which stores both a user function portion of system code and a process equipment portion of the system code, the processor controlling semiconductor processing equipment, the method comprising the steps of:

providing user data to the processor, the user data invoking the user function portion of the system code and suspending the process equipment portion of the system code;

providing a control value from external to the semiconductor system;

providing a first encoded value from external to the semiconductor system;

encoding a first portion of the control value and comparing said encoding of the first portion of the control value with the first encoded value to determine if the first portion of the control value is equivalent to the first encoded value and providing a first valid signal in response to an equivalence;

providing a second encoded value from external to the semiconductor system;

encoding a second portion of the control value and comparing said encoding of the second portion of the control value with the second encoded value to determine if the second portion of the control value is equivalent to the second encoded value and providing a second valid signal in response to an equivalence;

providing an enable signal in response to each of the first and second valid signals; and using the enable signal to invoke the process equipment portion of the system code.

2. The method of claim 1 wherein the step of providing a control value further comprises the steps of:

providing a lot number as the first portion of the control value; and providing a process operation identification value as the second portion of the control value.

3. The method of claim 1 wherein the step of providing user data further comprises the step of:

providing user data as either a password or a keystroke to invoke the user portion of the system code.

4. The method of claim 1 wherein one of the steps of providing the first encoded value or providing the second encoded value further comprises the step of:

using an external execution device to provide either the first or the second encoded value.

5. The method of claim 1 further comprising the steps of:

locking up access to the semiconductor system after the computer has determined that a predetermined number of errors in user input has occurred; and requiring the entry of a password to regain access to the semiconductor system after said step of locking up has occurred.

6. The method of claim 1 wherein the step of using the enable signal further comprises the step of:

suspending the user function portion of the system code.

7. A method for providing a control function to a semiconductor system, the semiconductor system having a processor coupled to a memory which stores both a user function portion of system code and a process equipment portion of the system code, the processor controlling semiconductor processing equipment, the method comprising the steps of:

invoking the user function portion of the system code and suspending the process equipment portion of the system code in response to user data provided by an external user;

accepting a control value from external to the semiconductor system in response to a first portion of the user function code of the system code;

accepting a first encoded value from external to the system in response to a second portion of the user function code of the system code;

encoding the first portion of the control value;

performing a first comparison to compare said encoding of the first portion of the control value with the first encoded value in response to a third portion of the user function code of the system code to determine if the first portion of the control value is equivalent to the first encoded value, the first comparison resulting in a first comparison result;

accepting a second encoded value from external to the semiconductor system in response to a fourth portion of the user function code of the system code;

encoding a second portion of the control value;

performing a second comparison to compare said encoding of the second portion of the control value with the second encoded value in response to a fifth portion of the user function code of the system code to determine if the second portion of the control value is equivalent to the second encoded value, the second comparison resulting in a second comparison results;

providing in response to a sixth portion of the user function code of the system code an enable data value by using the first comparison result and the second comparison result; and invoking the process equipment portion of the system code in response to the enable signal.

8. The method of claim 7 wherein the step of accepting a control value further comprises the steps of:

accepting a lot number as the first portion of the control value; and accepting a process operation identification value as the second portion of the control value.

9. The method of claim 7 wherein the step of invoking the user function portion of the system code further comprises the step of:

accepting user data as either a password or a keystroke to invoke the user portion of the system code.

10. The method of claim 7 wherein either the step of accepting the first encoded value or the step of accepting the second encoded value further comprises:

accepting either the first encoded value or the second encoded value from an external execution device.

11. The method of claim 7 further comprising the steps of:

locking out user access to the semiconductor system after the computer has determined that a predetermined number of errors in user input has occurred; and requiring the entry of a password to regain access to the semiconductor system after said step of locking out user access has occurred.

12. The method of claim 7 wherein the step of invoking the process equipment portion of the system code further comprises the step of:

suspending execution of the user function portion of the system code.

13. A semiconductor system with control functionality, the semiconductor system comprising:

a semiconductor process equipment unit; and a computer system coupled to the semiconductor process equipment unit, the computer system having means for receiving external data, the computer system comprising:

a processor for controlling the computer system;

a memory for storing computer system information and said external data;

a user function portion of system code stored in said memory for receiving, manipulating, and comparing user information with at least one predetermined encoded value to reduce semiconductor system errors; the at least one predetermined encoded value being input to the computer system from external to the computer system;

a process equipment portion of system code stored in said memory for controlling said semiconductor process equipment unit; and a task swapping portion of system code stored in said memory for selectively invoking either the user function portion of system code or the process equipment portion of system code based on said external data.

14. The semiconductor system of claim 13 further comprising:

a storage device coupled to the computer system for long term storage of computer information.

15. The semiconductor system of claim 13 further comprising:

an external execution device coupled to the computer system.

16. The semiconductor system of claim 15 wherein the external execution device further comprises:

means for wafer tracking, storing, and communicating information pertaining to a plurality of semiconductor wafer lots.

* * * * *